US010565348B2

(12) United States Patent
Lin et al.

(10) Patent No.: US 10,565,348 B2
(45) Date of Patent: *Feb. 18, 2020

(54) SYSTEM FOR AND METHOD OF FABRICATING AN INTEGRATED CIRCUIT

(71) Applicant: TAIWAN SEMICONDUCTOR MANUFACTURING COMPANY, LTD., Hsinchu (TW)

(72) Inventors: Wei-Cheng Lin, Taichung (TW); Chih-Liang Chen, Hsinchu (TW); Chih-Ming Lai, Hsinchu (TW); Charles Chew-Yuen Young, Cupertino, CA (US); Jiann-Tyng Tzeng, Hsinchu (TW); Kam-Tou Sio, Zhubei (TW); Ru-Gun Liu, Zhubei (TW); Shih-Wei Peng, Hsinchu (TW); Wei-Chen Chien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/458,852

(22) Filed: Jul. 1, 2019

(65) Prior Publication Data
US 2019/0325109 A1 Oct. 24, 2019

Related U.S. Application Data

(63) Continuation of application No. 15/258,932, filed on Sep. 7, 2016, now Pat. No. 10,366,200.

(51) Int. Cl.
*G06F 17/50* (2006.01)
(52) U.S. Cl.
CPC ...... *G06F 17/5081* (2013.01); *G06F 17/5072* (2013.01)

(58) Field of Classification Search
CPC .......................... G06F 17/5081; G06F 17/5072
(Continued)

(56) References Cited

U.S. PATENT DOCUMENTS 7,243,327 B1 7/2007 Tain et al.
8,245,174 B2 * 8/2012 Cheng ................. G06F 17/5068
716/126

(Continued)

FOREIGN PATENT DOCUMENTS

JP 2015149358 8/2015
KR 20150089938 8/2015
(Continued)

OTHER PUBLICATIONS

Notice of Allowance dated Jul. 24, 2018 and English translation from corresponding application No. 10-2017-0114473.
(Continued)

*Primary Examiner* — Jack Chiang
*Assistant Examiner* — Brandon Bowers
(74) *Attorney, Agent, or Firm* — Hauptman Ham, LLP

(57) ABSTRACT

A method of fabricating an integrated circuit is disclosed. The method includes defining a via grid, generating a first layout design of the integrated circuit based on at least the via grid or design criteria, generating a standard cell layout design of the integrated circuit, generating a via color layout design of the integrated circuit based on the first layout design and the standard cell layout design, performing a color check on the via color layout design based on design rules, and fabricating the integrated circuit based on at least the via color layout design. The first layout design has a first set of vias arranged in first rows and first columns based on the via grid. The standard cell layout design has standard cells and a second set of vias arranged in the standard cells. The via color layout design has a third set of vias.

20 Claims, 14 Drawing Sheets

(58) Field of Classification Search
USPC .......................................................... 716/52
See application file for complete search history.

(56) References Cited

U.S. PATENT DOCUMENTS

| | | |
|---|---|---|
| 8,601,416 B2 | 12/2013 | Kuo et al. |
| 8,762,900 B2 | 6/2014 | Shin et al. |
| 8,775,993 B2 | 7/2014 | Huang et al. |
| 8,853,860 B2 | 10/2014 | Griffith |
| 8,887,116 B2 | 11/2014 | Ho et al. |
| 8,943,445 B2 | 1/2015 | Chen et al. |
| 8,990,762 B2 | 3/2015 | Yuh et al. |
| 9,081,933 B2 | 7/2015 | Liu et al. |
| 9,087,174 B1 * | 7/2015 | Zhang ................... G03F 7/0035 |
| 9,183,341 B2 | 11/2015 | Chen et al. |
| 9,213,790 B2 | 12/2015 | Hsu et al. |
| 2009/0272982 A1 | 11/2009 | Nakamura et al. |
| 2012/0129301 A1 | 5/2012 | Or-Bach et al. |
| 2013/0122672 A1 | 5/2013 | Or-Bach et al. |
| 2014/0237435 A1 | 8/2014 | Chen et al. |
| 2014/0304670 A1 | 10/2014 | Su et al. |
| 2015/0278419 A1 | 10/2015 | Yang et al. |
| 2015/0370937 A1 | 12/2015 | Liu et al. |
| 2015/0370945 A1 | 12/2015 | Lee |

FOREIGN PATENT DOCUMENTS

| | | |
|---|---|---|
| KR | 20160039531 | 4/2016 |
| KR | 20160051532 | 5/2016 |
| TW | 200604865 | 2/2006 |
| TW | 2006034509 | 10/2006 |

OTHER PUBLICATIONS

Notice of Allowance dated Apr. 26, 2018 from corresponding application No. TW 106115171.

* cited by examiner

US 10,565,348 B2

SYSTEM FOR AND METHOD OF FABRICATING AN INTEGRATED CIRCUIT

PRIORITY CLAIM

The present application is a continuation of U.S. application Ser. No. 15/258,932, filed Sep. 7, 2016, now U.S. Pat. No 10,366,200, issued Jul. 30, 2019, which is incorporated herein by reference in its entirety.

BACKGROUND

As technology nodes of semiconductor manufacturing decrease, multiple patterning techniques (MPTs) are used to form features on a semiconductor wafer in closer proximity than is possible with a single patterning process. MPTs use multiple masks in order to form the features on the semiconductor wafer. Coloring refers to the assignment of a particular feature to a corresponding mask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
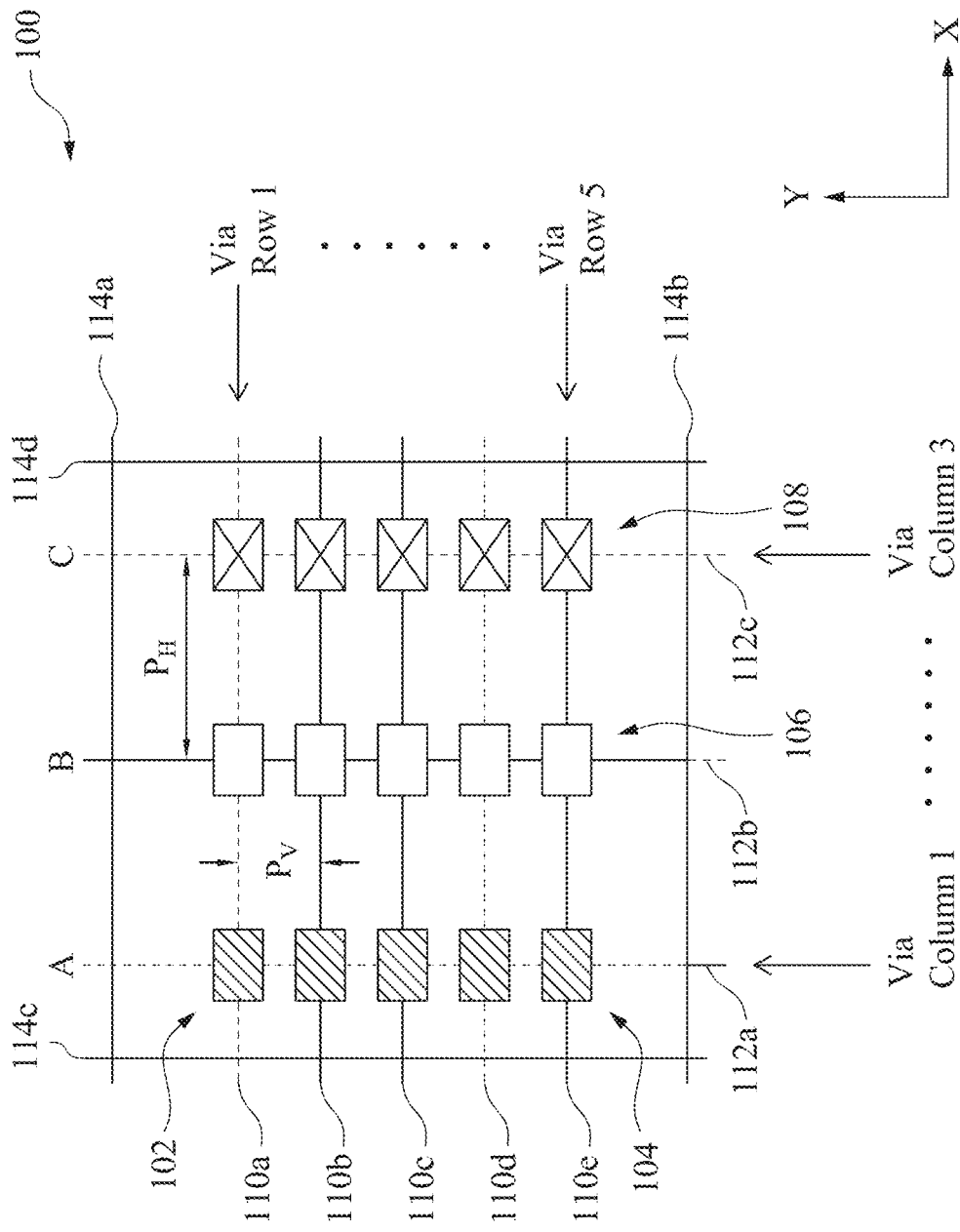
FIG. 1 is a diagram of a portion of a layout design usable as the first layout in FIG. 2 or FIG. 3, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a method of designing an integrated circuit includes generating a first layout of the integrated circuit based on design criteria, generating a standard cell layout of the integrated circuit, generating a via color layout of the integrated circuit based on the first layout and the standard cell layout, and performing a color check on the via color layout based on design rules.

In some embodiments, the first layout includes a first set of vias arranged in first rows and first columns. The first set of vias is divided into sub-sets of vias based on a corresponding color. The color indicates that vias of the sub-set of vias with a same color are to be formed on a same mask of a multiple mask set, and vias of the sub-set of vias with a different color are to be formed on a different mask of the multiple mask set.

Figure 8:
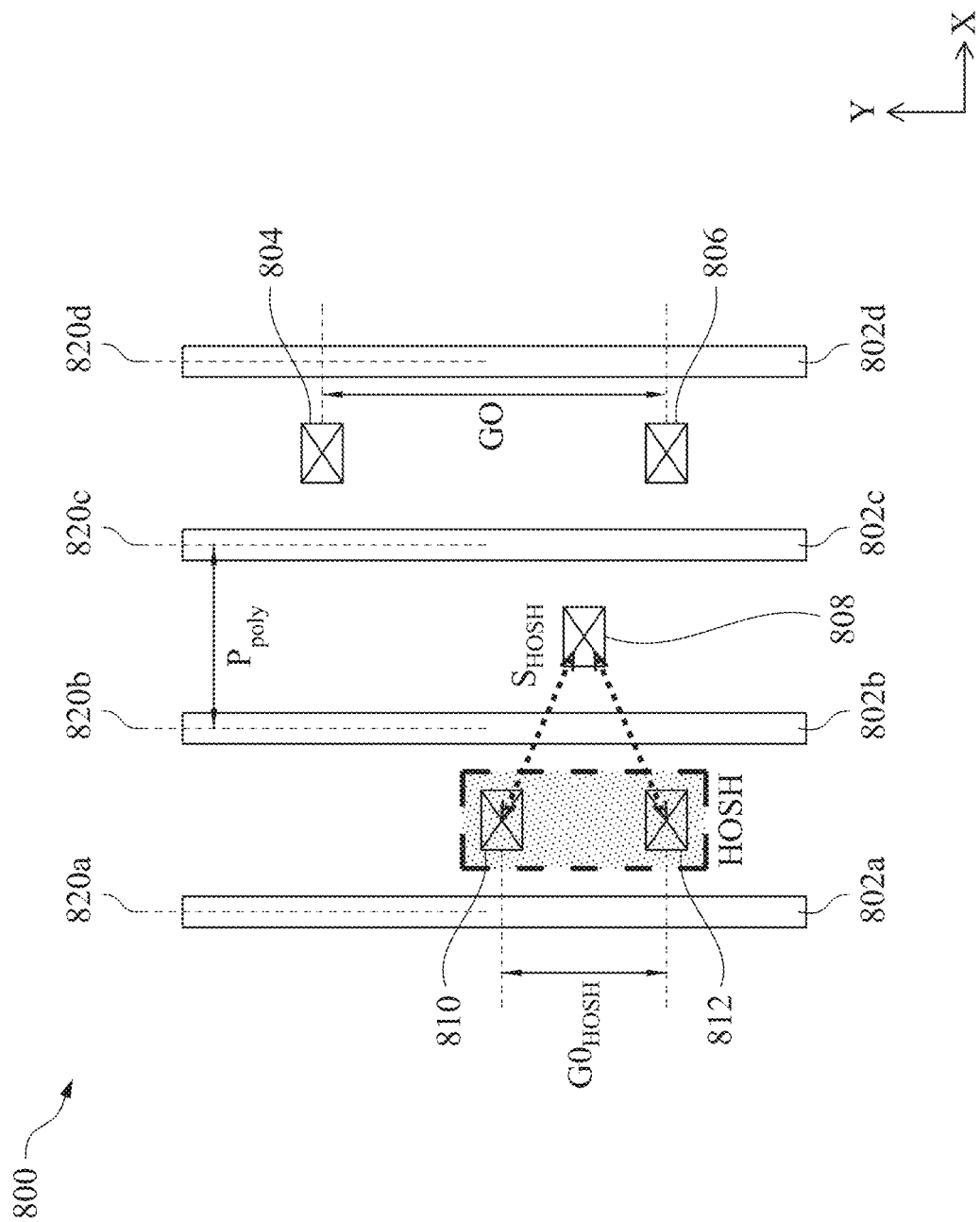
FIG. 8 is a diagram of a portion of a layout design usable as the via color layout in FIG. 2 or FIG. 3, in accordance with some embodiments.
Figures 9A, 9B:
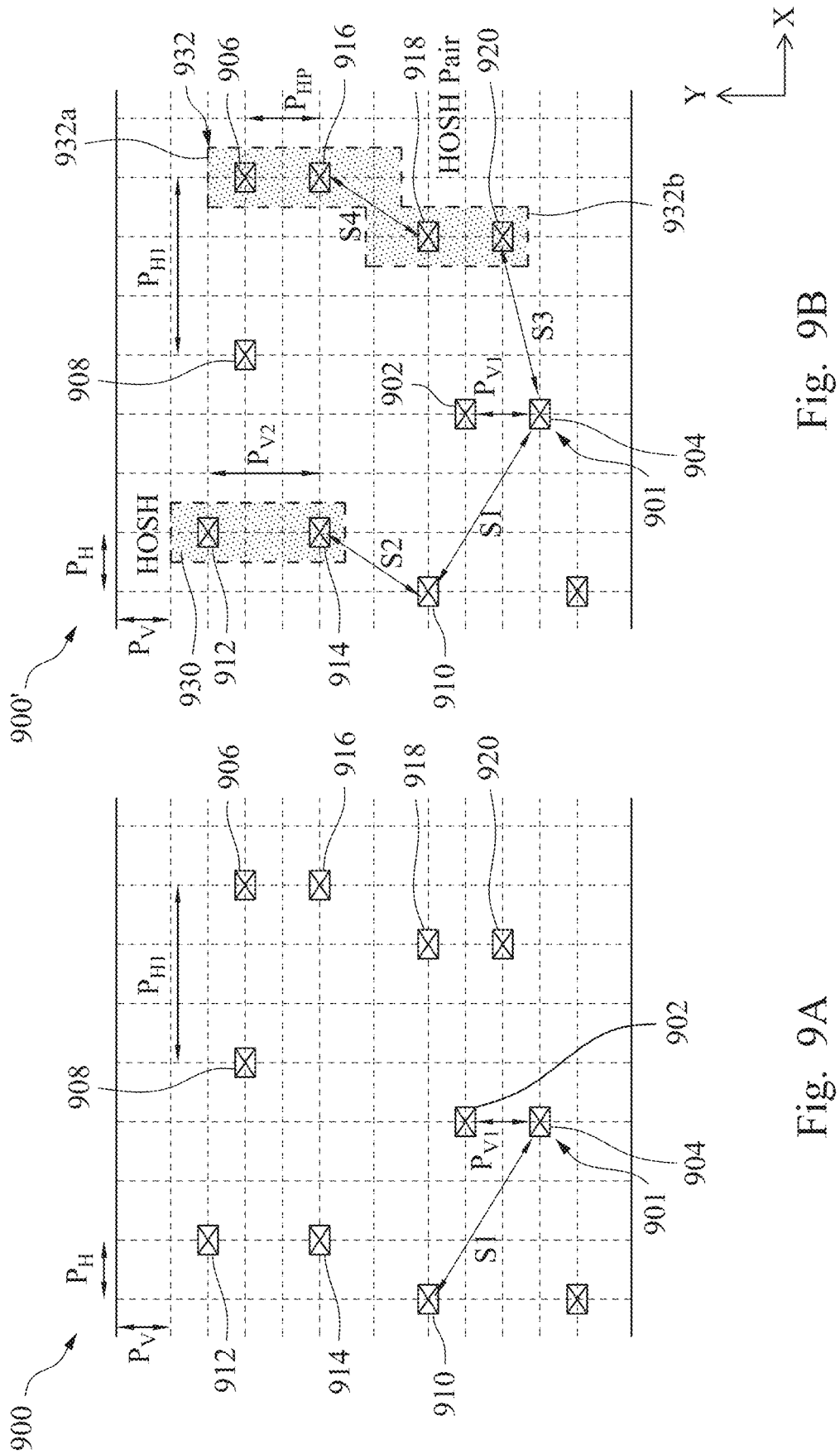
FIG. 9A is a diagram of a portion of a layout design usable as the first layout in FIG. 2 or FIG. 3, in accordance with some embodiments.
FIG. 9B is a diagram of a portion of a layout design usable as the via color layout in FIG. 2 or FIG. 3, in accordance with some embodiments.

In some embodiments, the vias in the first layout are arranged in a pre-defined coloring pattern. In some embodiments, the pre-defined coloring pattern is an optimized layout design suitable for use with a hole shrinkage (HOSH) process (FIGS. 8 & 9A-9B). In some embodiments, the vias in the first layout are aligned in a single direction, satisfy via coloring design rules and are suitable for use with the HOSH process (FIGS. 8 & 9A-9B). In some embodiments, the standard cell layout is uncolored. In some embodiments, the via color layout is colored based on the color information in the first layout. In some embodiments, the via color layout is an optimized layout design suitable for use with the HOSH process (FIGS. 8 & 9A-9B).

The first rows of the first set of vias are arranged in a first direction. The first columns of the first set of vias are arranged in a second direction different from the first direction. In some embodiments, the standard cell layout includes standard cells and a second set of vias arranged in the standard cells. Each via of the second set of vias is separated from each other by at least a minimum pitch. In some embodiments, the via color layout includes a third set of vias. The third set of vias includes a portion of the second set of vias and corresponding locations, and color of the corresponding sub-set of vias.

Figure 2:
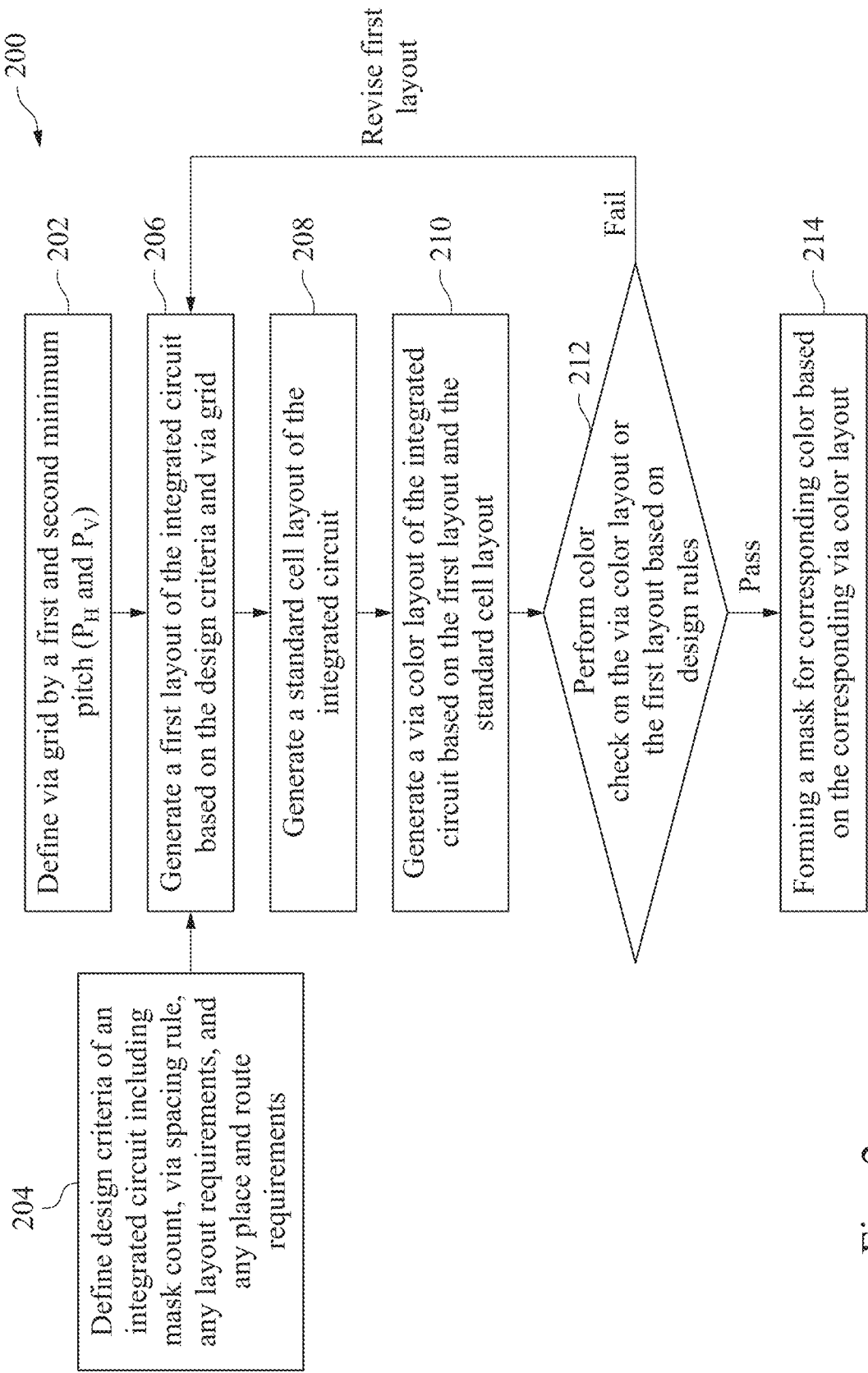
FIG. 2 is a flowchart of a method of forming a layout design in accordance with some embodiments.
Figure 3:
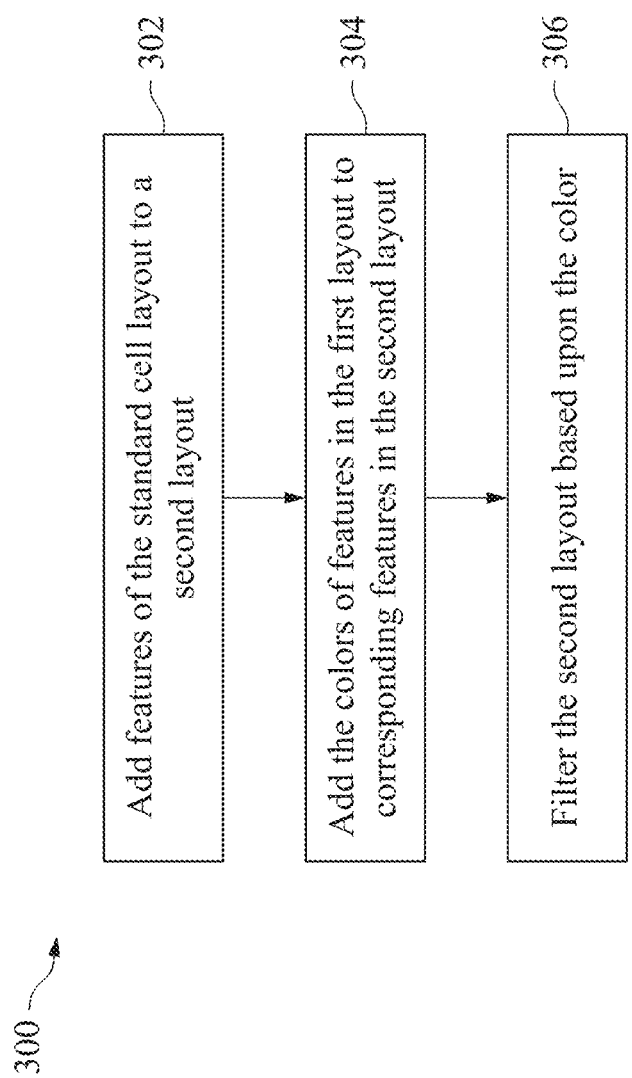
FIG. 3 is a flowchart of generating a via color layout, in accordance with some embodiments.

FIG. 1 is a diagram of a portion of a layout design usable as the first layout in FIG. 2 or FIG. 3, in accordance with some embodiments.

Layout design 100 is a portion of a layout of an integrated circuit. Layout design 100 includes a set of vias 102 arranged in an array having 5 rows and 3 columns. The 5 rows of vias are arranged in a first direction X. The 3 columns of vias are arranged in a second direction Y different from the first direction X. Five rows and three columns are used for illustration. A different number of rows or columns is within the contemplated scope of the present disclosure.

The set of vias 102 are located in a cell boundary 114a, 114b, 114c and 114d. The set of vias 102 includes one or more vias. In some embodiments, each via of the set of vias 102 has the same physical dimensions. The set of vias 102 is divided into sub-sets of vias 104, 106 or 108 based on a corresponding color A, B or C. The color A, B, or C indicates that the vias of each sub-set with a same color are to be formed on a same mask of a multiple mask set, and vias of the sub-set of vias 104, 106 or 108 with a different color are to be formed on a different mask of the multiple mask set. Three colors A, B and C are depicted in FIG. 1 as an example. In some embodiments, there are more or less than three colors in layout design 100.

Vias of the sub-set of vias 104 have color A and are arranged in via Column 1. Vias of the sub-set of vias 106 have color B and are arranged in via column 2. Vias of the sub-set of vias 108 have color C and are arranged in via column 3.

Gridlines 110a, 110b, 110c, 110d and 110e (collectively referred to as "gridlines 110") and gridlines 112a, 112b and 112c (collectively referred to as "gridlines 112") are arranged in an array having rows and columns. Gridlines 110 are arranged in first direction X and gridlines 112 are arranged in second direction Y. Each gridline of gridlines 110 is separated from an adjacent gridline of gridlines 110 by a pitch $P_V$. Each gridline of gridlines 112 is separated from an adjacent gridline of gridlines 112 by a pitch $P_H$.

Gridlines 110 or 112 define regions where vias in the set of vias 102 are positioned. For example, a center portion of each via of the set of vias 102 is located where gridlines 110 intersect with gridlines 112. Via rows 1, 2, 3, 4 and 5 are aligned with corresponding gridlines 110a, 110b, 110c, 110d and 110e. Via columns 1, 2 and 3 are aligned with corresponding gridlines 112a, 112b and 112c. In some embodiments, gridlines 110 or gridlines 112 are positioned based upon locations of features (not shown) in upper or lower layers of layout design 100 being connected by the set of vias 102 or the process utilized to form the integrated circuit.

FIG. 2 is a flowchart of a method 200 of forming a layout design of an integrated circuit in accordance with some embodiments. It is understood that additional operations may be performed before, during, and/or after the method 200 depicted in FIG. 2, and that some other processes may only be briefly described herein.

In operation 202 of method 200, a via grid (e.g., array of gridlines 110 and 112 (FIG. 1)) is defined by a minimum pitch $P_H$ (FIGS. 1 and 5) in first direction X and a minimum pitch $P_V$ (FIGS. 1 and 5) in second direction Y. The array of gridlines 110 and 112 (FIG. 1) or the array of gridlines 410 and 412 (FIGS. 4-5) is an embodiment of the via grid of operation 202. In some embodiments, the via grid is received from an external component in operation 202. In some embodiments, the via grid is generated based on received information from a user or an external component.

Figure 5:
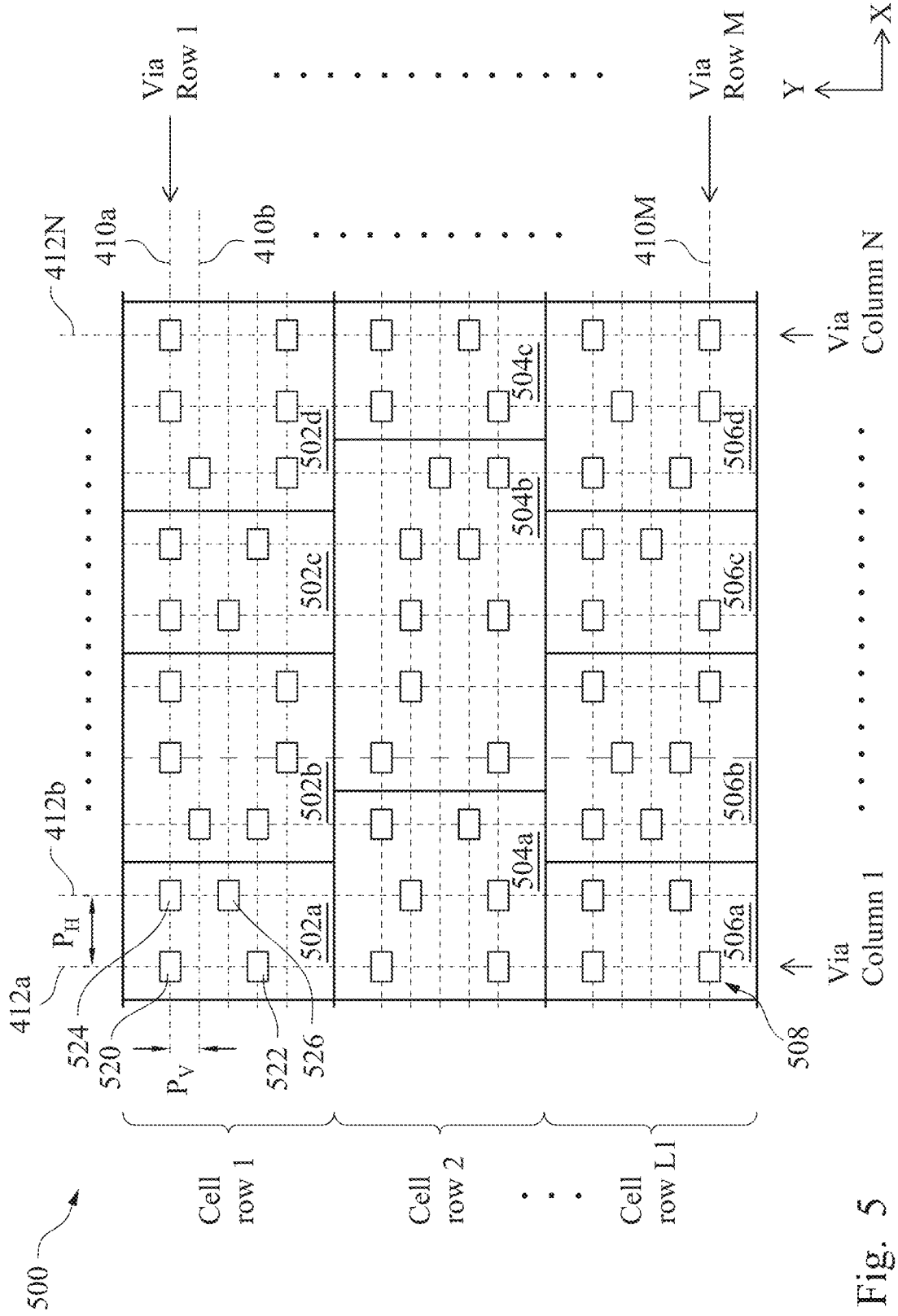
FIG. 5 is a diagram of a portion of a layout design usable as the standard cell layout in FIG. 2 or FIG. 3, in accordance with some embodiments.

Method 200 continues with operation 204, where design criteria of the integrated circuit are defined. In some embodiments, the design criteria are received from a user or an external component in operation 204. In some embodiments, the design criteria are generated based on received information from the user or the external component. In some embodiments, the design criteria of the integrated circuit include a mask count of the integrated circuit, via spacing rules (e.g., G0, $G0_{HOSH}$ and $S_{HOSH}$ (FIG. 8) and hole shrinkage (HOSH) rules (e.g., formulas 9-14 and aligned vias (FIGS. 8 & 9A-9B)) of the integrated circuit, layout requirements (e.g., minimum spacing) of the integrated circuit, or place and route requirements of the integrated circuit. The mask count corresponds to a number of masks to be utilized to manufacture the integrated circuit. The mask count is two or more. In some embodiments, layout requirements of the integrated circuit include minimum spacing between two vias in the same row or column (FIG. 5). In some embodiments, place and route requirements of the integrated circuit include minimum spacing requirements between power plan vias (FIGS. 12A-12B) and adjacent vias of a same color. In some embodiments, an adjacent via is a via located one column or one row away from another via.

Method 200 continues with operation 206, where a first layout (e.g., layout design 100 (FIG. 1) or layout design 400 (FIG. 4)) of the integrated circuit is generated based on the design criteria and the via grid. The first layout of operation 206 is an embodiment of layout design 100 (FIG. 1). The first layout includes a first set of vias (e.g., vias 102 (FIG. 1) or vias 404 (FIG. 4)) arranged in rows and columns. The first set of vias (e.g., vias 102 (FIG. 1) or vias 404 (FIG. 4)) are divided into sub-sets of vias (e.g., sub-sets of vias 104, 106 or 108 (FIG. 1)) based on a corresponding color (e.g., color A, B, C (or D for quadruple patterning)). In some embodiments, the first layout is a pre-defined colored layout of vias that is used with a HOSH process (FIGS. 8 & 9A-9B). In some embodiments, the first layout is an optimized pre-defined layout of colored vias suitable for use with the HOSH process (FIGS. 8 & 9A-9B). In some embodiments, there are more or less than three colors in the first layout of operation 206.

Method 200 continues with operation 208, where a standard cell layout (e.g., layout design 500 (FIG. 5)) of the integrated circuit is generated. The standard cell layout (e.g., layout design 500 (FIG. 5)) includes standard cells (e.g., standard cells 510 (FIG. 5)) and a second set of vias (e.g., set of vias 508 (FIG. 5)) arranged in the standard cells. In some embodiments, the second set of vias is arranged throughout the standard cells. In some embodiments, a standard cell (e.g., standard cells 510 (FIG. 5)) is a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, clock cells, or the like. Each via of the second set of vias is separated from each other by at least a minimum pitch. In some embodiments, a via of the second set of vias is configured to electrically connect a standard cell of the standard cells to other layers in the integrated circuit. In some embodiments, a via of the second set of vias is configured to electrically connect a standard cell of the standard cells to other standard cells in the integrated circuit. The second set of vias or the standard cells is uncolored. In some embodiments, the standard cell layout is generated from pre-designed layouts of standard cells or vias that are stored in cell libraries. In some embodiments, the second set of vias is part of the standard cells that are stored in cell libraries.

Method 200 continues with operation 210, where a via color layout (e.g., layout design 600 (FIG. 6)) of the integrated circuit is generated based on the first layout (e.g., layout design 100 (FIG. 1) or layout design 400 (FIG. 4)) and the standard cell layout (e.g., layout design 500 (FIG. 5)). In some embodiments, the via color layout includes a third set of vias (e.g., set of vias 608 (FIG. 6)). The third set of vias includes a portion of the second set of vias and corresponding locations, and color of the corresponding sub-set of vias. A size of the third set of vias is less than or equal to a size of the second set of vias.

The via color layout (e.g., layout design 600 (FIG. 6)) includes features from the standard cell layout (e.g., layout design 500 (FIG. 5)) and the first layout (e.g., layout design 100 (FIG. 1) or layout design 400 (FIG. 4)). For example, from the standard cell layout (e.g., layout design 500 (FIG. 5)), the via color layout (e.g., layout design 600 (FIG. 6)) includes standard cells and corresponding locations of the standard cells, and a portion of the second set of vias and corresponding locations of the portion of the second set of vias. For example, from the first layout (e.g., layout design 100 (FIG. 1) or layout design 400 (FIG. 4)), the via color layout (e.g., layout design 600 (FIG. 6)) includes the color of the corresponding sub-set of vias.

In some embodiments, the via color layout (e.g., layout design 600 (FIG. 6)) comprises standard cells and corresponding locations of the standard cells, third set of vias and corresponding locations of the third set of vias, and the color of the corresponding sub-set of vias from the first layout (e.g., layout design 100 (FIG. 1) or layout design 400 (FIG. 4)).

The via color layout (e.g., layout design 600 (FIG. 6)) is generated for a single color. In some embodiments, operation 210 is repeated to generate a via color layout (e.g., layout design 600 (FIG. 6)) for each corresponding color. In some embodiments, operation 210 includes performing a color mapping between the first layout (e.g., layout design 100 (FIG. 1) or layout design 400 (FIG. 4)) and the standard cell layout (e.g., layout design 500 (FIG. 5)). In some embodiments, via color layout (e.g., layout design 600 (FIG. 6)) is an optimized layout design suitable for use with the HOSH process (FIGS. 8 & 9A-9B).

Method 200 continues with operation 212, where a color check is performed on the via color layout (e.g., layout design 600 (FIG. 6)) or the first layout (e.g., layout design 100 (FIG. 1) or layout design 400 (FIG. 4)) based on design rules. The color check performed in operation 212 includes determining if the via color layout (e.g., layout design 600 (FIG. 6)) or the first layout (e.g., layout design 100 (FIG. 1) or layout design 400 (FIG. 4)) complies with design rules.

If the via color layout (e.g., layout design 600 (FIG. 6)) or the first layout (e.g., layout design 100 (FIG. 1) or layout design 400 (FIG. 4)) is determined to have passed the color check, then method 200 proceeds to operation 214. If the via color layout (e.g., layout design 600 (FIG. 6)) or the first layout (e.g., layout design 100 (FIG. 1) or layout design 400 (FIG. 4)) is determined to have failed the color check, then method 200 returns to operation 206, where the first layout (e.g., layout design 100 (FIG. 1) or layout design 400 (FIG. 4)) is revised. In some embodiments, if the first layout is revised, the via color layout is also revised (e.g., generated based on the revised first layout). In some embodiments, operations 206, 208, 210 and 212 of method 200 are repeated until the revised first layout and corresponding revised via color layout pass operation 212. In some embodiments, method 200 is repeated until the via color layout is suitable for use with the HOSH process (FIGS. 8 & 9A-9B). In some embodiments, operation 212 includes displaying a result of the color check. In some embodiments, a result of the color check includes a pass or failure of one or more design rules and a corresponding location of the pass or failure of the one or more design rules. In some embodiments, the results are displayed by a user interface (not shown).

In some embodiments, the design rules include spacing requirements between each of the vias in the via color layout (e.g., layout design 600 (FIG. 6)). For example, if the vias in the via color layout (e.g., layout design 600 (FIG. 6)) are not sufficiently separated from each other, the vias cannot be consistently manufactured due to shorted out vias. In some embodiments, the design rules depend upon the number of masks or colors used in the integrated circuit design, the suitability of vias in the layout design for the HOSH process (FIGS. 8 & 9A-9B).

In some embodiments, the design rules include pitch spacing requirements between vias (e.g., first and second geometric requirements (FIGS. 10A-10B & 11A-11B)). In some embodiments, the design rules include requirements for the HOSH process (e.g., regular via patterns and formulas 9-14 (FIGS. 8 & 9A-9B)). In some embodiments, the design rules include via pitches for the HOSH process (e.g., S1, S2, and S3) and via pitches (e.g., $P_{H1}$, $P_{V1}$ $P_{H2}$ and pitch $P_{V2}$, and pitch $P_{HP}$ (FIGS. 8 & 9A-9B)). In some embodiments, the design rules include via spacing rules defined in the design criteria of operation 204.

Method 200 continues with operation 214, where a mask is formed for the corresponding color based on the corresponding via color layout (e.g., layout design 600 (FIG. 6)). In some embodiments, method 200 is repeated for each color to form a multiple mask set, where each mask has a different corresponding color. In some embodiments, after operation 214, the multiple mask set is used to form an integrated circuit.

One or more of operations 202-214 is performed by a processing device configured to execute instructions for forming a layout design of an integrated circuit. In some embodiments, an operation of operations 202-214 is performed using a same processing device as that used in another of operations 202-214. In some embodiments, a different specific purpose processing device is used to perform an operation of operations 202-214 from that used to perform another of operations 202-214.

FIG. 3 is a flowchart of a method 300 of generating a via color layout of an integrated circuit in accordance with some embodiments. It is understood that additional operations may be performed before, during, and/or after the method 300 depicted in FIG. 3, and that some other processes may only be briefly described herein.

Figure 7:
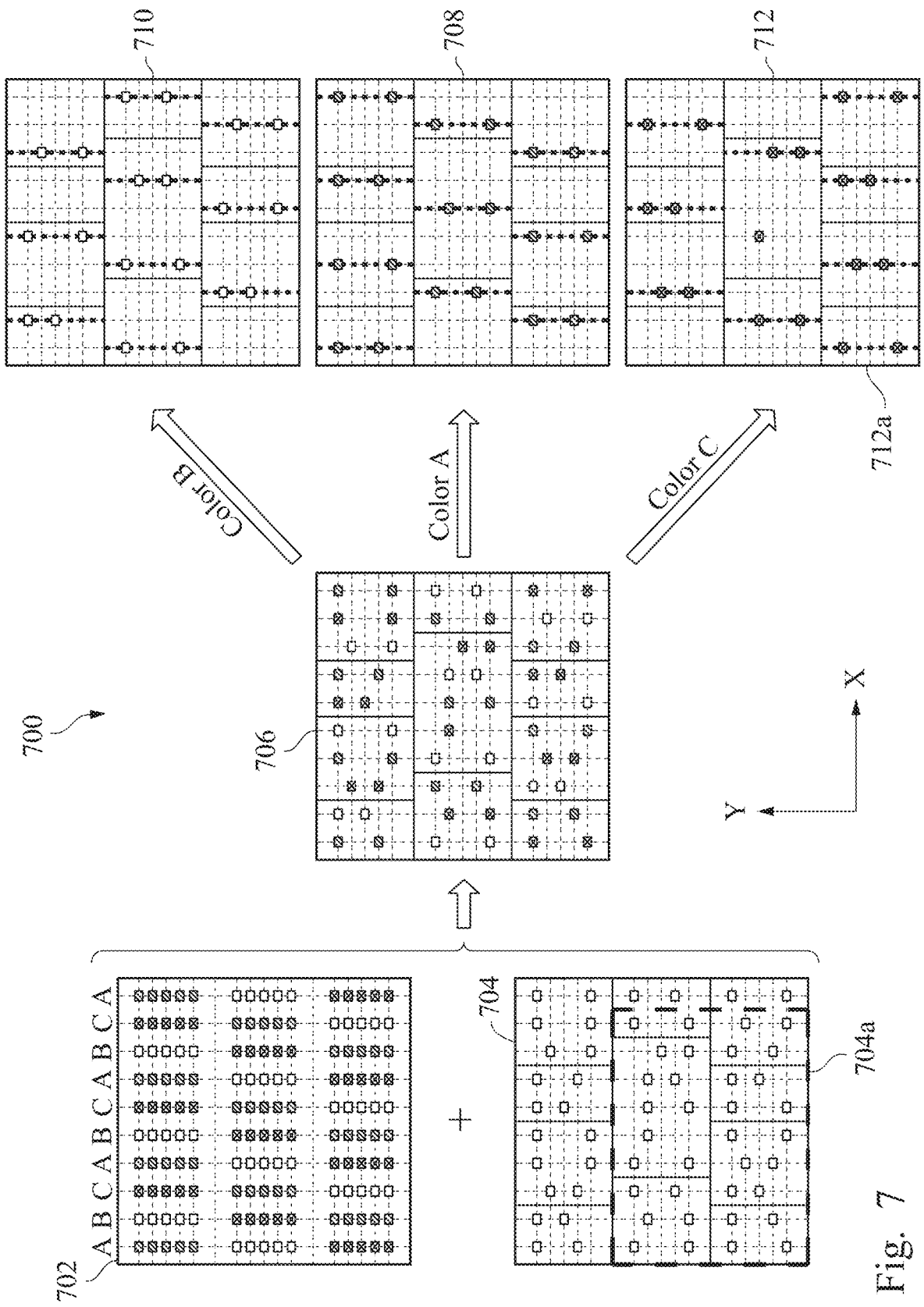
FIG. 7 is a diagram of views of layout designs during the method in FIG. 2 or FIG. 3, in accordance with some embodiments.

Method 300 is an embodiment of operation 210 of FIG. 2 with similar elements. In some embodiments, method 300 is an embodiment of performing a color mapping between the first layout (e.g., layout design 100 (FIG. 1) or layout design 400 (FIG. 4)) and the standard cell layout (e.g., layout design 500 (FIG. 5)) of operation 210 of FIG. 2 with similar elements. A graphical illustration of FIG. 3 according to some embodiments is shown in FIG. 7.

In operation 302 of method 300, features of the standard cell layout (e.g., layout design 500 (FIG. 5)) are added to a second layout (e.g., layout design 706 (FIG. 7)). In some embodiments, the features of the standard cell layout (e.g., layout design 500 (FIG. 5)) include the second set of vias and corresponding locations. In some embodiments, the features of the standard cell layout (e.g., layout design 500 (FIG. 5)) are added to the second layout (e.g., layout design 706 (FIG. 7)) at the same corresponding locations in the second layout (e.g., layout design 706 (FIG. 7)). In some embodiments, operation 302 comprises adding the set of standard cells, the second set of vias and corresponding locations of the set of standard cells and the second set of vias to the second layout (e.g., layout design 706 (FIG. 7)) at same corresponding locations in the second layout (e.g., layout design 706 (FIG. 7)).

Method 300 continues with operation 304, where the colors of features in the first layout (e.g., layout design 100 (FIG. 1) or layout design 400 (FIG. 4)) are added to corresponding features in the second layout (e.g., layout design 706 (FIG. 7)). In some embodiments, the features of the first layout (e.g., layout design 100 (FIG. 1) or layout design 400 (FIG. 4)) include the first set of vias, and the corresponding features in the second layout (e.g., layout design 706 (FIG. 7)) include the second set of vias. In some embodiments, operation 304 comprises adding the color of a via in the first set of vias to a corresponding via in the second layout (e.g., layout design 706 (FIG. 7)), if the via in the first set of vias has a same location as a via in the second set of vias. In these embodiments, operation 304 is repeated for each via in the second set of vias.

Method 300 continues with operation 306, where the second layout (e.g., layout design 706 (FIG. 7)) is filtered based upon the color. Each via in the filtered second layout (e.g., layout design 600 (FIG. 6) or layout design 708, 710 or 712 (FIG. 7)) has the same color. The filtered second layout (e.g., layout design 600 (FIG. 6) or layout design 708, 710 or 712 (FIG. 7)) is the via color layout. In some embodiments, the first layout (e.g., layout design 100 (FIG. 1) or layout design 400 (FIG. 4)) and the standard cell layout (e.g., layout design 500 (FIG. 5)) have a same size in the first direction X, and a same size in the second direction Y.

One or more of operations 302-306 is performed by a processing device configured to execute instructions for generating a via color layout (e.g., layout design 600) of an integrated circuit. In some embodiments, an operation of operations 302-306 is performed using a same processing device as that used in another of operations 302-306. In some embodiments, a different processing device is used to perform an operation of operations 302-306 from that used to perform another of operations 302-306.

Using at least one of the presently disclosed methods, the first layout (e.g., layout design 100 (FIG. 1) or layout design 400 (FIG. 4)) or via color layout (e.g., layout design 600 (FIG. 6) or layout design 708, 710 or 712 (FIG. 7)) is generated with simpler design rules and satisfy spacing rules with more stringent requirements than other approaches. Also, the first layout or via color layout according to one or more embodiments is generated with simpler coloring design rules or coloring design rule checks than other approaches. Additionally, the first layout or via color layout resulting from one or more embodiments is utilized with processes that have better process control than other approaches.

Using at least one of the presently disclosed embodiments, the first layout or via color layout is utilized with smaller via spacing rules than other approaches and utilized with HOSH/HOSH pair processes (FIGS. 8 & 9A-9B) that build integrated circuits with smaller via spacings and cheaper masks than other approaches. Also, the via color layout is generated according to one or more embodiments with via patterns aligned in a single direction and the via color layout is capable of being utilized with HOSH/HOSH pair processes (FIGS. 8 & 9A-9B).

In some embodiments, the vias in the first layout are arranged in a pre-defined via coloring pattern yielding a layout design (e.g., via color layout (e.g., layout design 600 (FIG. 6) or layout design 708, 710 or 712 (FIG. 7))) that is colorable. In some embodiments, the pre-defined via coloring pattern is implemented in triple pattern, triple etch (3P3E) or quadruple pattern, quadruple etch (4P4E).

Figure 4:
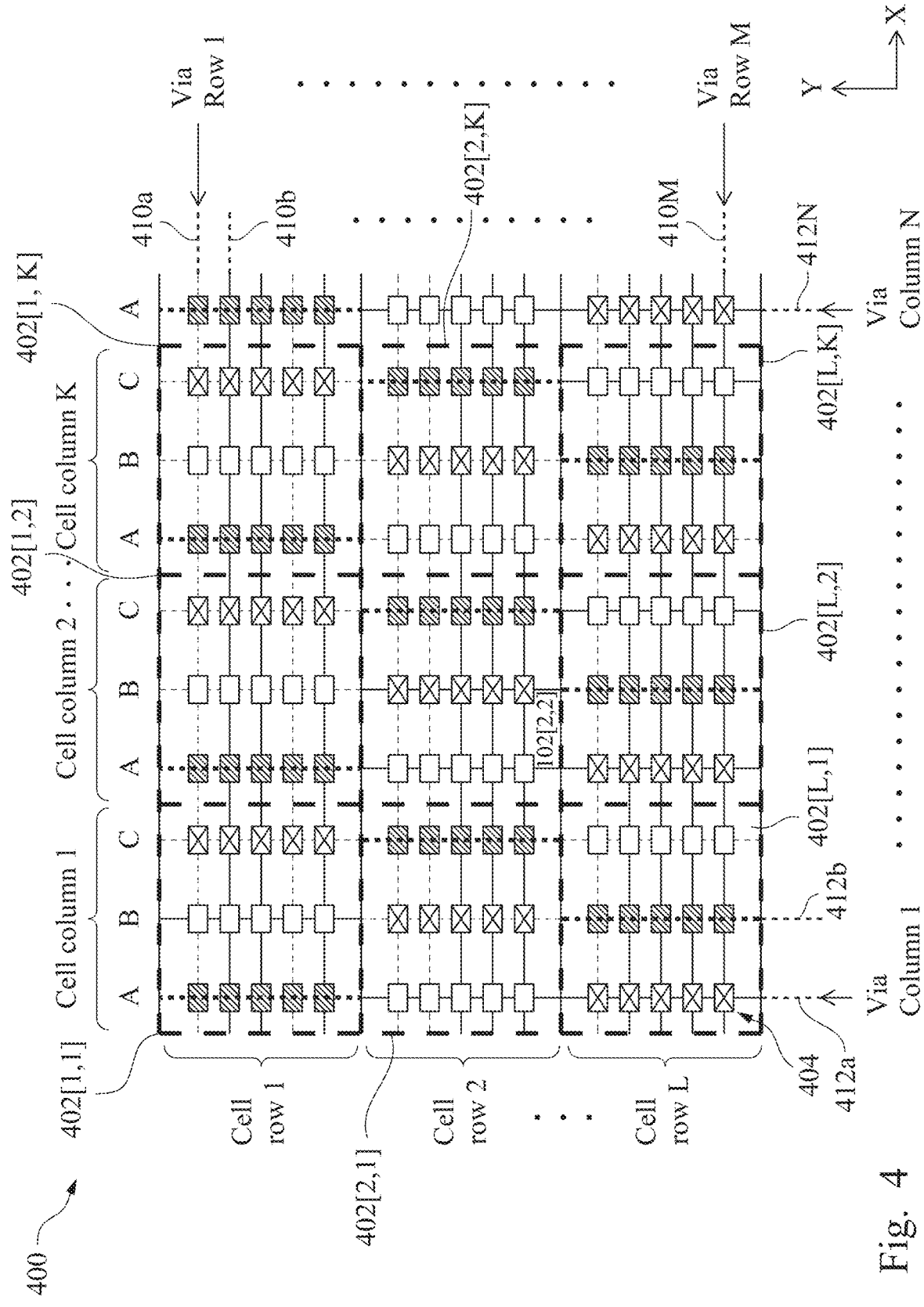
FIG. 4 is a diagram of a portion of a layout design usable as the first layout in FIG. 2 or FIG. 3, in accordance with some embodiments.

FIG. 4 is a diagram of a portion of a layout design 400 usable as the first layout in FIG. 2 or FIG. 3, in accordance with some embodiments.

Layout design 400 is an embodiment of layout design 100 (FIG. 1).

Layout design 400 includes a set of vias 404 arranged in M rows and N columns, where M is an integer corresponding to the number of rows of vias in layout design 400 and N is an integer corresponding to the number of columns of vias in the layout design 400. The set of vias 404 has one or more vias. The M rows of vias are arranged in the first direction X and the N columns of vias are arranged in the second direction Y.

Gridlines 410a, 410b, . . . 410M (collectively referred to as "gridlines 410") and gridlines 412a, 412b, . . . 412N (collectively referred to as "gridlines 412") are arranged in an array having M rows and N columns. Gridlines 410 are arranged in first direction X and gridlines 412 are arranged in second direction Y. Gridlines 410 are aligned with the M rows of vias. Gridlines 412 are aligned with the N columns of vias. The set of vias 404 is located at an intersection of gridlines 410 and 412. In some embodiments, gridlines 410 or gridlines 412 are positioned based upon locations of features (not shown) in upper or lower layers of layout design 400 being connected by set of vias 404 or the process utilized to form the integrated circuit.

Set of vias 404 are grouped into a plurality of cells (402[1,1], 402[1,2], 402[1,K], 402[2,1], 402[2,2], 402[2,K], 402[L,1], 402[L,2] and 402[L,K] collectively referred to as "cells 402") arranged in an array having L rows of cells and K columns of cells, where L is an integer corresponding to the number of rows of cells and K is an integer corresponding to the number of columns of cells in layout design 400. The L rows of cells are arranged in first direction X. The K columns of cells are arranged in second direction Y.

Each cell of cells 402 is layout design 100 (FIG. 1). Each cell of cells 402 includes a set of vias arranged in an array having 5 rows and 3 columns. Five rows and three columns are used for illustration. A different number of rows or columns are within the contemplated scope of the present disclosure. In some embodiments, each cell of cells 402 is the same size in the first direction X. In some embodiments, each cell of cells 402 is the same size in the second direction Y.

FIG. 5 is a diagram of a portion of a layout design 500 usable as the standard cell layout in FIG. 2 or FIG. 3, in accordance with some embodiments.

Layout design 500 includes standard cells 502a, 502b, 502c, 502d, 504a, 504b, 504c, 506a, 506b, 506c, 506d (collectively referred to as "standard cells 510") and a set of vias 508. Set of vias 508 are arranged in standard cells 510. A number of vias of the set of vias 508 and the corresponding locations in standard cells 510 is used for illustration. A different number of vias of the set of vias 508 or corresponding locations in each cell of standard cells 510 is within the contemplated scope of the present disclosure. Standard cells 510 include other features, but are not shown for ease of illustration. In some embodiments, a standard cell of standard cells 510 is a logic gate cell.

Standard cells 502a, 502b, 502c and 502d are arranged in cell row 1. Standard cells 504a, 504b and 504c are arranged in cell row 2. Standard cells 506a, 506b, 506c and 506d are arranged in cell row L1, where L1 is an integer corresponding to the number of rows of cells in layout design 500. The L1 rows of cells are arranged in first direction X. In some embodiments, a number of cell rows L1 in layout design 500 is the same as a number of rows L in layout design 400. In some embodiments, the size (in the first direction X or the second direction Y, respectively) of a standard cell of standard cells 510 in FIG. 5 is the same as a size (in the first direction X or the second direction Y) of a cell of cells 402 in FIG. 4.

Set of vias 508 are positioned at some of the intersections of gridlines 410 and gridlines 412. Each via of the set of vias 508 is separated from each other in the second direction Y by at least a minimum pitch $P_V$. Each via of the set of vias 508 is separated from each other in the first direction X by at least a minimum pitch $P_H$. In some embodiments, minimum pitch $P_H$ is equal to minimum pitch $P_V$. In some embodiments, minimum pitch $P_H$ is not equal to minimum pitch $P_V$. In some embodiments, as part of the layout requirement of the design criteria of operation 204, 2 vias in a same column are separated from each other by at least 2 minimum pitches (e.g., $P_V$). In some embodiments, as part of the layout requirement of the design criteria of operation 204, 2 vias in a same row are separated from each other by at least 1 minimum pitch (e.g., $P_H$). A different number of minimum pitches are within the contemplated scope of the present disclosure.

Standard cell 502a includes via 520, 522, 524 and 526. Via 520 and via 524 are separated from each other by a first pitch (not shown). The first pitch (not shown) is equal to minimum pitch $P_H$. Via 522 and via 526 are separated from each other by a second pitch (not shown). The second pitch (not shown) is greater than minimum pitch $P_V$.

In some embodiments, a via of the set of vias 508 is configured to electrically connect a standard cell of standard cells 510 to other layers in the integrated circuit. In some embodiments, a via of the set of vias 508 is configured to electrically connect a standard cell of standard cells 510 to other standard cells in the integrated circuit. The set of vias 508 or the standard cells 510 is uncolored.

Figure 6:
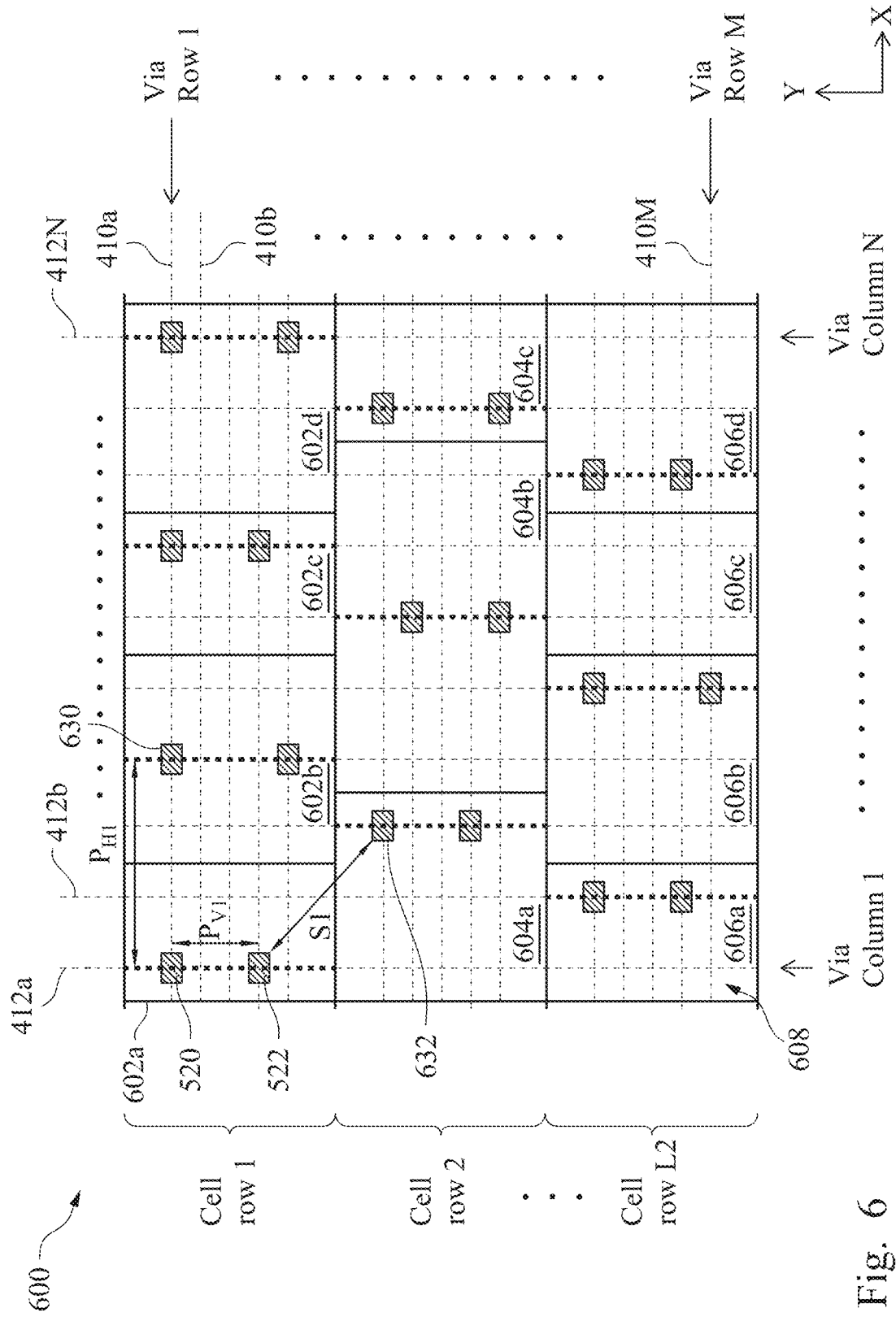
FIG. 6 is a diagram of a portion of a layout design usable as the via color layout in FIG. 2, in accordance with some embodiments.

FIG. 6 is a diagram of a portion of a layout design usable as the via color layout in FIG. 2, in accordance with some embodiments.

Layout design 600 is usable as second layout of FIG. 3 after operation 306. In some embodiments, layout design 600 is derived from layout design 400 (FIG. 4) and layout design 500 (FIG. 5). In comparison with layout design 400 of FIG. 4, layout design 600 does not include vias of colors B and C.

Layout design 600 includes cells 602a, 602b, 602c, 602d, 604a, 604b, 604c, 606a, 606b, 606c, 606d (collectively referred to as "cells 610") and set of vias 608. In some embodiments, cells 610 correspond to standard cells 510 (FIG. 5). Set of vias 608 are derived from set of vias 508 (FIG. 5). Set of vias 608 are an embodiment of third set of vias in operation 210 of method 200 (FIG. 2).

Set of vias 608 are arranged in cells 610. In some embodiments, each pair of vias in set of vias 608 in a corresponding cell of cells 610 is aligned in the second direction Y. In some embodiments, each pair of vias in set of vias 608 in a corresponding cell of cells 610 are aligned in the second direction X. In some embodiments, if the vias are aligned in a single direction and meet other design rules (FIGS. 8A-8B), the vias are manufactured using a HOSH or HOSH pair process.

Set of vias 608 includes vias 520, 522, 630 and 632 and other vias (not labelled). Set of vias 608 has a single color (e.g., color A). A number of vias of the set of vias 608 and the corresponding locations in cells 610 is used for illustration. A different number of vias of the set of vias 608 or corresponding locations in each cell of cells 610 is within the contemplated scope of the present disclosure. Cells 610 include other features, but are not shown for ease of illustration.

In comparison with FIG. 5, a number of vias in set of vias 608 is less than a number of vias in set of vias 508. In comparison with FIG. 5, set of vias 608 has a color (e.g., color A).

Cell 602a includes via 520 and via 522. In comparison with FIG. 5, cell 602a does not include vias 524 and 526, and vias 520 and 522 have a color (e.g., color A).

Via 520 and via 630 are separated from each other in the first direction X by pitch $P_{H1}$. The pitch $P_{H1}$ is greater than minimum pitch $P_H$. Pitch $P_{H1}$ is the center to center pitch between two vias of the set of vias 608 in the first direction X.

Via 520 and via 522 are separated from each other in the second direction Y by pitch $P_{V1}$. The pitch $P_{V1}$ is greater than minimum pitch $P_V$. Pitch $P_{V1}$ is the center to center pitch between two vias of the set of vias 608 in the second direction Y.

Via 522 and via 632 are separated from each other in any direction by pitch S1. In some embodiments, the pitch S1 is greater than a minimum pitch G0 (FIG. 8). The minimum pitch G0 (FIG. 8) is defined as a minimum pitch between two vias manufactured by a same mask (e.g., same color).

FIG. 7 is a diagram of portions of layout designs usable during the method in FIG. 3, in accordance with some embodiments.

Layout design 702 is a variation of layout design 400 (FIG. 4). Layout design 702 is usable as the first layout in method 200 (FIG. 2) in accordance with one or more embodiments.

Layout design 704 is a variation of layout design 500 (FIG. 5). Layout design 704 is usable as the standard cell layout in method 200 (FIG. 2) in accordance with one or more embodiments.

Layout design 706 is derived from layout design 400 (FIG. 4) and layout design 500 (FIG. 5).

Layout design 708 is an embodiment of layout design 600 (FIG. 6). Layout design 710 is an embodiment of layout design 600 (FIG. 6). Layout design 712 is an embodiment of layout design 600 (FIG. 6). Layout design 708, 710 or 712 is usable as the via color layout in method 200 (FIG. 2) in accordance with one or more embodiments.

Layout design 702 is usable as the first layout during operation 304 of method 300 in accordance with one or more embodiments.

Layout design 704 is usable as the standard cell layout during operation 302 of method 300 in accordance with one or more embodiments.

Layout design 706 is usable as the second layout in method 300 in accordance with one or more embodiments. Method 300 utilizes the features of layout design 702 and layout design 704 to generate layout design 706.

Layout design 708 is an embodiment of a layout design that corresponds to the filtered second layout after operation 306 of method 300 in accordance with one or more embodiments. In some embodiments, layout design 706 is filtered based on color A during operation 306, resulting in layout design 708.

Layout design 710 is an embodiment of a layout design that corresponds to the filtered second layout after operation 306 of method 300 in accordance with one or more embodiments. In some embodiments, layout design 706 is filtered based on color B during operation 306, resulting in layout design 710.

Layout design 712 is an embodiment of a layout design that corresponds to the filtered second layout after operation 306 of method 300 in accordance with one or more embodiments. In some embodiments, layout design 706 is filtered based on color C during operation 306, resulting in layout design 712.

Layout design 704 includes a layout region 704a. In other words, layout region 704a is a portion of layout design 704. Layout design 712 includes a layout region 712a. In other words, layout region 712a is a portion of layout design 712.

FIG. 8 is a diagram of a portion of a layout design 800 usable as the via color layout in FIG. 2 or FIG. 3, in accordance with some embodiments.

Layout design 800 is a part of layout region 712a.

Layout design 800 illustrates embodiments of via spacing rules of via pitches (e.g., G0, $G0_{HOSH}$ and $S_{HOSH}$) that are part of the design criteria of operation 204 of method 200 (FIG. 2).

Layout design 800 includes poly regions 802a, 802b, 802c and 802d (collectively referred to as "poly regions 802"). Layout design 800 further includes vias 804, 806, 808, 810 and 812 (collectively referred to as "vias 820"). Vias 820 have a same color C.

Poly regions 802 extend in the second direction Y and are separated from each other in the first direction X. Poly regions 802a, 802b, 802c and 802d are aligned with corresponding gridlines 820a, 820b, 820c and 820d (collectively referred to as "gridlines 820"). Gridlines 820a, 820b, 820c and 820d extend in the second direction Y through a center of each corresponding poly region 802a, 802b, 802c and 802d. Poly regions 802 are separated from each other by a minimum poly pitch $P_{poly}$ in the first direction X. Minimum poly pitch $P_{poly}$ is the center to center poly pitch between regions 802. In some embodiments, minimum poly pitch $P_{poly}$ is the edge to edge pitch between regions 802. In some embodiments, poly regions 802 extend (not shown) in the first direction X and are separated from each other in the second direction Y (not shown), rather than extending in the second direction Y (as shown in FIG. 8) and being separated from each other in the first direction X. In these embodiments, poly regions 802 are separated from each other by a minimum poly pitch $P_{poly}$ in the second direction Y. Poly pitch $P_{poly}$ corresponds to a minimum spacing requirement for the poly regions 802 in order to increase precision of the manufacturing process of the integrated circuit by a single mask.

Via 804 and via 806 are separated from each other in the second direction Y by a minimum via pitch G0. Via pitch G0 corresponds to a minimum spacing requirement between two vias in a single mask. Via pitch G0 is measured from the center of each via of vias 820.

In some embodiments, a relationship between via pitch G0 and poly pitch $P_{poly}$ is expressed by formula 1:

$$P_{poly} \leq G0 \leq 3*P_{poly} \quad (1)$$

Via 810 and via 812 are separated from each other in the second direction Y by a minimum via pitch $G0_{HOSH}$. Via pitch $G0_{HOSH}$ corresponds to a minimum spacing requirement between two vias in a single mask and formed by a HOSH process. The two vias in a single mask and formed by the HOSH process are referred to as HOSH vias. Vias not formed by the HOSH process are referred to as non-HOSH vias. HOSH vias have an area that is less than an area of non-HOSH vias. In some embodiments, HOSH vias have a diameter that is less than a diameter of non-HOSH vias.

Via pitch $G0_{HOSH}$ is measured from the center of via 810 and 812. Vias 810 and 812 are characterized as HOSH vias.

In some embodiments, a relationship between via pitch $G0_{HOSH}$ and poly pitch $P_{poly}$ is expressed by formula 2:

$$0.5*P_{poly} \leq G0_{HOSH} \leq 2*P_{poly} \quad (2)$$

In some embodiments, the HOSH process ensures precision manufacturing of the integrated circuit by a single mask by reducing a size of the HOSH vias using the HOSH process. In some embodiments, if the size of the HOSH vias is not reduced, the HOSH vias are not sufficiently spaced to be manufactured on the same mask.

A HOSH process includes forming at least a first hole and a second hole in an insulating layer. In some embodiments, the insulating layer is over a substrate. Examples of materials for the insulating layer include, but are not limited to, SiC, SiCO, SiCN, another insulating material, or a combination thereof. The insulating layer has a top surface and a bottom surface. In some embodiments, the first hole and the second hole extend from the bottom surface of the insulating layer to the top surface of the insulating layer. In some embodiments, the first hole and the second hole are aligned with each other in the first direction X or the second direction Y. In some embodiments, the first hole and the second hole have a same area as each other. In some embodiments, the first hole and the second hole have a same diameter as each other. The first hole and the second hole are separated from each other by a first distance. A different number of holes formed in the insulating layer is within the contemplated scope of the present disclosure. The first hole and second hole are formed by a first etching process. The first etching process includes a wet etching process, a dry etching process, a chemical etching process, a plasma etching process, another suitable etching process, or a combination thereof.

The HOSH process further includes filling the first hole and the second hole with a first conductive material. The first conductive material and the insulating layer are referred to as a metallization layer. In some embodiments, the first conductive material includes copper, aluminum, nickel, titanium, tungsten, cobalt, carbon, alloys thereof or another suitable conductive material that is formed in one or more layers by one or more of a physical vapor deposition process, a chemical vapor deposition process, a plating process, or other suitable process. In some embodiments, filling the first hole and the second hole with the first conductive material includes performing a chemical mechanical planarization (CMP) process to remove excess first conductive material that is not filled in the first hole or the second hole.

The HOSH process further includes depositing an intermetal dielectric (IMD) layer over the metallization layer. In some embodiments, the IMD layer includes low-k dielectric materials, such as carbon-containing low-k dielectric materials, which may further include silicon, oxygen, nitrogen, or a combination thereof. The IMD layer has a top surface and a bottom surface.

The HOSH process further includes forming at least a third hole and a fourth hole in the IMD layer. In some embodiments, the third hole and the fourth hole extend from the bottom surface of the IMD layer to the top surface of the IMD layer. In some embodiments, the third hole and the fourth hole are aligned with each other in the first direction X or the second direction Y. In some embodiments, the third hole and the fourth hole are aligned with each other in the same direction as the first hole and the second hole. In some embodiments, the third hole and the fourth hole have a same area as each other. In some embodiments, an area of the first hole or the second hole is the same as an area of the third hole or the fourth hole. The third hole and the fourth hole are formed by a second etching process. The second etching process includes a wet etching process, a dry etching process, a chemical etching process, a plasma etching process, another suitable etching process, or a combination thereof. In some embodiments, the third hole and the fourth hole have a same diameter as each other. In some embodiments, a diameter of first hole or the second hole is the same as a diameter of the third hole or the fourth hole. The third hole and the fourth hole are separated from each other by a second distance. In some embodiments, the first distance is equal to the second distance. A different number of holes formed in the IMD layer is within the contemplated scope of the present disclosure.

The HOSH process further includes filling the third hole and the fourth hole with a second conductive material. In some embodiments, the second conductive material includes copper, aluminum, nickel, titanium, tungsten, cobalt, carbon, alloys thereof or another suitable conductive material, that is formed in one or more layers by one or more of a physical vapor deposition process, a chemical vapor deposition process, a plating process, or other suitable process. In some embodiments, filling the third hole and the fourth hole with the first conductive material includes performing a CMP process to remove excess second conductive material that is not filled in the third hole or the fourth hole. The first and second conductive materials within the first hole, second hole, third hole and fourth hole are configured as HOSH vias. In some embodiments, the HOSH vias are configured to interconnect devices, e.g., transistors, resistors, capacitors, diode, and other active and passive devices, underlying the metallization layer.

In some embodiments, the HOSH process includes other steps or a different order of operations than that already disclosed. In some embodiments, the HOSH process further includes forming one or more mask layers or one or more resist layers. In some embodiments, the one or more mask layers or one or more resist layers are used to form one or more of the first hole, second hole, third hole or fourth hole. In some embodiments, the one or more resist layers are patterned.

In some embodiments, via pitch $G0_{HOSH}$ is less than via pitch G0. Vias formed by the HOSH process can be formed closer together than vias manufactured not using the HOSH process.

Via 808 is separated from via 810 or via 812 by a minimum via pitch $S_{HOSH}$. Via pitch $S_{HOSH}$ corresponds to a minimum spacing requirement between a HOSH via (e.g., via 810 or 812) and another via in a single mask. Via pitch $S_{HOSH}$ is measured from the center of via 810 or 812 to via 808.

In some embodiments, a relationship between via pitch $S_{HOSH}$ and poly pitch $P_{poly}$ is expressed by formula 3:

$$P_{poly} \leq S_{HOSH} \leq 3*P_{poly} \quad (3)$$

Integrated circuit designs with via pitches (e.g., G0, $G0_{HOSH}$ and $S_{HOSH}$) that satisfy the minimum spacing requirements expressed by formulas 1-3 ensure precision manufacturing of the integrated circuit by a single mask/color capable of overcoming manufacturing variations.

In some embodiments, masks manufactured having dimensions greater than corresponding minimum spacing requirements results in manufactured integrated circuits able to overcome manufacturing variations and increases the yield. In some embodiments, masks manufactured having dimensions that do not meet the minimum spacing requirements of formulas 1-3 results in manufactured integrated circuits with possible flaws due to manufacturing variations or insufficient spacing between components and lowers the yield.

FIG. 9A is a diagram of a portion of a layout design 900 usable as the via color layout in FIG. 2 or FIG. 3, in accordance with some embodiments.

Layout design 900 is a part of layout region 712a (FIG. 7). Layout design 900 is an embodiment of layout design 600 (FIG. 6).

Layout design 900 illustrates a set of spacing requirements that are included as part of the design rules of operation 212 of method 200 (FIG. 2). The set of spacing requirements includes pitches between vias (e.g., $P_{H1}$, $P_{V1}$ and S1) and minimum spacing requirements between vias in layout design 900 of an integrated circuit formed by a same mask/same color (e.g., color C). The set of spacing requirements are specified by formulas 4-8. The design rules of operation 212 of method 200 (FIG. 2) include the set of spacing requirements specified by formulas 4-8. In some embodiments, layout design 900 illustrates non-HOSH vias that satisfy the requirements of formulas 4-8.

Layout design 900 includes vias 901. Vias 901 are an embodiment of set of vias 608 (FIG. 6). Vias 901 includes vias 902, 904, 906, 908, 910, 912, 914, 916, 918, 920 and other vias (not labelled). Vias 901 have a single color (e.g., color C). A number of vias 901 and the corresponding locations are used for illustration. A different number of vias 901 or corresponding locations is within the contemplated scope of the present disclosure. Layout design 900 includes other features, but is not shown for ease of illustration.

A via of vias 901 and another via of vias 901 are aligned with each other in the second direction Y and are separated by a pitch $P_{V1}$. For example, vias 902 and 904 are aligned in the second direction Y (e.g., along the same column). Vias 902 and 904 are separated from each other in the second direction Y by pitch $P_{V1}$. Via pitch $P_{V1}$ is measured from the center of vias 902 and 904. In some embodiments, pitch $P_{V1}$ is greater than the minimum pitch $P_V$ (FIG. 5) of the layout pattern 900.

Pitch $P_{V1}$ is part of the design rules of operation 212 of method 200 (FIG. 2). Pitch $P_{V1}$ is the distance between two vias in a single mask, and the two vias being aligned in the second direction Y. In some embodiments, a Pitch $P_{V1}$ is expressed by formula 4:

$$P_{V1} = P_V * N1 \tag{4}$$

where N1 is a positive integer and pitch $P_V$ is the minimum pitch of a layout pattern 900 (e.g., via color layout) or layout pattern 500 (e.g., standard cell layout).

In some embodiments, a relationship between pitch $P_{V1}$ and the minimum via pitch G0 is expressed by formula 5:

$$P_{V1} \geq G0 \tag{5}$$

A via of vias 901 and another via of vias 901 that are aligned with each other in the first direction X are separated by a pitch $P_{H1}$. For example, vias 906 and 908 are aligned in the first direction X (e.g., along the same row). Vias 906 and 908 are separated from each other in the first direction X by pitch $P_{H1}$. Via pitch $P_{H1}$ is measured from the center of vias 906 and 908. The pitch $P_{H1}$ is greater than the minimum pitch $P_H$ (FIG. 5) of the layout pattern 900.

Pitch $P_{H1}$ is part of the design rules of operation 212 of method 200 (FIG. 2). Pitch $P_{H1}$ is the distance between two vias in a single mask, and the two vias being aligned in the first direction X. In some embodiments, a Pitch $P_{H1}$ is expressed by formula 6A:

$$P_{H1} = P_H * N2 = P_H * M * N3 \tag{6A}$$

Where N2 is a multiple of masks M expressed by formula 6B and pitch $P_H$ is the minimum pitch of a layout pattern 900 (e.g., via color layout) or layout pattern 500 (e.g., standard cell layout) in the first direction X.

Multiple N2 is a positive integer. In some embodiments, multiple N2 is expressed by formula 6B:

$$N2 = M * N3 \tag{6B}$$

Where M is a number of masks and N3 is a positive integer. As shown by formulas 6A and 6B, pitch $P_{H1}$ is a multiple of the minimum pitch $P_H$ of layout pattern 900. For example, in some embodiments, if a number of masks M is equal to 3, the multiple N2 corresponds to the sequence 3, 6, 9, for corresponding values of N3 being equal to 1, 2, 3, respectively. For example, in some embodiments, if a number of masks M is equal to 4, the multiple N2 corresponds to the sequence 4, 8, 12, for corresponding values of N3 being equal to 1, 2, 3, respectively.

In some embodiments, a relationship between pitch $P_{H1}$ and the minimum via pitch G0 is expressed by formula 7:

$$P_{H1} \geq G0 \tag{7}$$

A via of vias 901 and another via of vias 901 are separated by a pitch S1. Pitch S1 is measured between vias 901 not aligned in a single direction. For example, vias 910 and 904 are separated from each other by pitch S1. In this example, vias 910 and 904 are not aligned in the first direction X (e.g., along the same row) or the second direction (e.g., along the same column). Via pitch S1 is measured from the center of vias 910 and 904. In some embodiments, pitch S1 is measured between vias 901 aligned in a single direction (not shown). For example, in these embodiments, via pitch S1 corresponds to pitch $P_{H1}$ or pitch $P_{V1}$.

Pitch S1 is part of the design rules of operation 212 of method 200 (FIG. 2). Pitch S1 is a distance between two vias in a single mask. In some embodiments, the two vias are separated from each other by pitch S1 are not aligned in the first direction X and the second direction Y. In some embodiments, a relationship between pitch S1 and the minimum via pitch G0 is expressed by formula 8:

$$S1 \geq G0 \tag{8}$$

In some embodiments, integrated circuit designs with via pitches (e.g., $P_{H1}$, $P_{V1}$ and S1) that satisfy the design rules of operation 212 (FIG. 2) of method 200 (e.g., formulas 4-8), ensure precision manufacturing of the integrated circuit by a single mask/color capable of overcoming manufacturing variations.

In some embodiments, masks manufactured having dimensions greater than corresponding minimum spacing requirements results in manufactured integrated circuits able to overcome manufacturing variations and increases the yield. In some embodiments, masks manufactured having dimensions less than corresponding minimum spacing requirements results in manufactured integrated circuits with possible flaws due to manufacturing variations or insufficient spacing between components and lowers the yield.

FIG. 9B is a diagram of a portion of a layout design 900' usable as the via color layout in FIG. 2 or FIG. 3, in accordance with some embodiments.

Layout design 900' is a part of layout region 712a (FIG. 7). Layout design 900' is an embodiment of layout design 600 (FIG. 6). Layout design 900' is a variation of layout design 900 (FIG. 9).

Layout design 900' is a diagram of another set of spacing requirements that are included as part of the design rules of operation 212 of method 200 (FIG. 2). The another set of spacing requirements includes pitches for HOSH vias (e.g., $P_{H2}$, $P_{V2}$ and S2), pitches for HOSH pair vias (e.g., $P_{HP}$, and S3) and minimum spacing requirements between HOSH vias, HOSH pair vias and non-HOSH vias in layout design 900' of an integrated circuit formed by a same mask/same color (e.g., color C). The another set of spacing requirements are specified by formulas 9-14. The design rules of operation 212 of method 200 (FIG. 2) include the set of spacing requirements specified by formulas 4-8. In some embodiments, layout design 900 illustrates non-HOSH vias that satisfy the requirements of formulas 4-8.

Layout design 900' is a diagram of an embodiment that includes vias manufactured by the HOSH process. In some embodiments, the requirements for vias manufactured by the HOSH process are regular via patterns and satisfaction of the spacing requirements provided by formulas 9 or 10 and 11-14. Regular via patterns are via patterns that are aligned in a single direction with respect to each other. In some embodiments, the design rules of operation 212 of method 200 (FIG. 2) include determining if vias are regular via patterns and satisfaction of the another set of spacing requirements provided by formulas 9-14. In some embodiments, the features of layout design 900' that are not configured to use the HOSH process still satisfy the requirements of formulas 4-8 for non-HOSH vias (e.g., vias 902, 904 and 908).

For illustration, vias 912 and 914 are enclosed with a hashed line ("HOSH") and are referred to as "HOSH vias 930." If vias 912 and 914 meet the requirements of formulas 9-14 (shown below) and are regular patterns (e.g., aligned in a single direction), then vias 912 and 914 are manufactured using the HOSH process. In some embodiments, regular via patterns are via patterns aligned in first direction X or second direction Y (e.g., along the same column or row).

HOSH vias are two or more vias that satisfy the HOSH spacing requirements (e.g., pitch S2, pitch $P_{H2}$ and pitch $P_{V2}$) of formulas 9-11. HOSH vias are manufactured using the HOSH process. In some embodiments, HOSH vias also satisfy HOSH geometric requirements including (a) two or more vias being equidistant from each other in the first direction X or the second direction Y or (b) two or more vias being aligned with each other in the first direction X or the second direction Y.

For example, vias 912 and 914 are aligned in the second direction Y (e.g., along the same column) and therefore are regular patterns. Vias 912 and 914 are separated from each other in the second direction Y by pitch $P_{V2}$. Via pitch $P_{V2}$ is measured from the center of vias 912 and 914. As shown in FIG. 9B, the pitch $P_{V2}$ is greater than the minimum pitch $P_V$ (FIG. 5) of the layout pattern 900.

Pitch $P_{V2}$ is part of the design rules of operation 212 of method 200 (FIG. 2) for HOSH vias. Pitch $P_{V2}$ is a distance between two HOSH vias aligned in the second direction Y, where the two HOSH vias are formed in a single mask using the HOSH process. In some embodiments, a relationship between pitch $P_{V2}$, the minimum via pitch G0 and $G0_{HOSH}$ is expressed by formula 9.

$$G0 \geq P_{V2} \geq G0_{HOSH} \qquad (9)$$

where G0 is the minimum spacing requirement between two vias in a single mask, and $G0_{HOSH}$ is the minimum spacing requirement between two HOSH vias in a single mask and made by a HOSH process.

In another embodiment, for regular via patterns that are aligned in the first direction X (e.g., along the same row), a via pitch $P_{H2}$ (not shown) and formula 10 are utilized rather than formula 9 and pitch $P_{V2}$. For example, in this embodiment, if vias 912 and 914 were separated from each other in the first direction X, rather than the second direction Y, then vias 912 and 914 are separated from each other by pitch $P_{H2}$ (not shown), and formula 10 is utilized to check the spacing requirements of the HOSH process. In this example, via pitch $P_{H2}$ is measured from the center of vias 912 and 914.

Pitch $P_{H2}$ (not shown) is part of the design rules of operation 212 of method 200 (FIG. 2) for HOSH vias. Pitch $P_{H2}$ (not shown) is a distance between two HOSH vias aligned in the first direction X, where the two HOSH vias are formed in a single mask using the HOSH process. In some embodiments, a relationship between pitch $P_{H2}$ (not shown) and the minimum via pitch G0 and $G0_{HOSH}$ is expressed by formula 10.

$$G0 \geq P_{H2} \geq G0_{HOSH} \qquad (10)$$

A HOSH via and a non-HOSH via are separated from each other by a pitch S2. For example, vias 910 and 914 are separated from each other by pitch S2. In this example, vias 910 and 914 are not aligned in the first direction X (e.g., along the same row) or the second direction (e.g., along the same column). Via pitch S2 is measured from the center of vias 910 and 914. In some embodiments, pitch S2 is measured between a HOSH via and a non-HOSH via that are aligned in a single direction (not shown). For example, in these embodiments, via pitch S2 corresponds to pitch $P_{H2}$ or pitch $P_{V2}$.

Pitch S2 is part of the design rules of operation 212 of method 200 (FIG. 2) for pitches between HOSH vias and non-HOSH vias. Pitch S2 is a distance between a HOSH via (e.g., via 912 or 914) and a non-HOSH via (e.g., via 902, 904, 908 or 910) in a single mask. In this embodiment, the HOSH via (e.g., via 912 or 914) and the non-HOSH via (e.g., via 902, 904, 908 or 910) are not aligned in the first direction X and the second direction Y.

In some embodiments, a relationship between pitch S2 and the minimum via pitch $S_{HOSH}$ is expressed by formula 11:

$$S2 \geq S_{HOSH} \qquad (11)$$

For illustration, vias 906, 916, 918 and 920 are enclosed with a hashed line ("HOSH Pair") and are referred to as "HOSH pair vias 932." If vias 906, 916, 918 and 920 meet the requirements of formulas 9-14 (e.g., formulas 12-14 are shown below) and are regular patterns (e.g., aligned in a single direction), then vias 906, 916, 918 and 920 are manufactured using the HOSH process.

A HOSH pair is four or more HOSH vias that satisfy HOSH pair geometric requirements and the HOSH pair spacing requirements (e.g., pitch S3 and pitch $P_{HP}$) of formulas 12-14. HOSH pairs are manufactured using the HOSH process.

In some embodiments, the HOSH pair geometric requirements are two sets of HOSH vias that are offset from one another by one minimum pitch (e.g., $P_H$) in the first direction X (e.g., row) or one minimum pitch (e.g., $P_V$ in the second direction Y (e.g., column).

In some embodiments, a HOSH pair is four HOSH vias arranged as two sets of HOSH vias, where each set of HOSH vias are offset from another by one minimum pitch (e.g., $P_H$) in the first direction X (e.g., row) or one minimum pitch (e.g., $P_V$) in the second direction Y (e.g., column), and each set of HOSH vias includes two vias.

For example, vias 906, 916, 918 and 920 are HOSH vias that form a HOSH pair via 932. HOSH pair via 932 includes a first HOSH via 932a and a second HOSH via 932b. First HOSH via 932a is shifted from second HOSH via 932b by 1 column in the first direction X, and by 4 rows in the second direction Y. Shifting first HOSH via 932a from second HOSH via 932b by a different number of rows or columns is within the contemplated scope of the present disclosure.

First HOSH via 932a includes vias 906 and 916. Vias 906 and 916 are aligned in the second direction Y (e.g., along the same column) and therefore are regular patterns. Vias 906 and 916 are separated from each other in the second direction Y by pitch $P_{HP}$. Via pitch $P_{HP}$ is measured from the center of vias 906 and 916. As shown in FIG. 9B, the pitch $P_{HP}$ is greater than the minimum pitch $P_H$ (FIG. 5) of the layout pattern 900'.

Second HOSH via 932b includes vias 918 and 920. Vias 918 and 920 are aligned in the second direction Y (e.g., along the same column) and therefore are regular patterns. Vias 918 and 920 are separated from each other in the second direction Y by pitch $P_{HP}$. Via pitch $P_{HP}$ is measured from the center of vias 918 and 920.

Pitch $P_{HP}$ is part of the design rules of operation 212 of method 200 (FIG. 2) for HOSH pair vias. Pitch $P_{HP}$ is a distance between two HOSH vias (of a HOSH pair) that are to be formed in a single mask using the HOSH process when the two HOSH vias are aligned in the first direction X or the second direction Y. In some embodiments, a relationship between pitch $P_{HP}$, the minimum via pitch G0 and the minimum via pitch $G0_{HOSH}$ is expressed by formula 12.

$$G0 \geq P_{HP} \geq G0_{HOSH} \qquad (12)$$

where G0 is the minimum spacing requirement between two vias in a single mask, and $G0_{HOSH}$ is the minimum spacing requirement between two vias in a single mask and made by a HOSH process.

A HOSH pair via and a non-HOSH via are separated from each other by a pitch S3. For example, vias 920 and 904 are separated from each other by pitch S3. In this example, vias 920 and 904 are not aligned in the first direction X (e.g., along the same row) or the second direction (e.g., along the same column). Via pitch S3 is measured from the center of vias 920 and 904. In some embodiments, pitch S3 is measured between a HOSH pair via and a non-HOSH via that are aligned in a single direction (not shown). For example, in these embodiments, via pitch S3 is equal to pitch $P_{H2}$ (not shown) or pitch $P_{V2}$.

Pitch S3 is part of the design rules of operation 212 of method 200 (FIG. 2) for pitches between HOSH pair vias and non-HOSH vias. Pitch S3 is a distance between a HOSH pair via (e.g., via 906, 916, 918 or 920) and a non-HOSH via (e.g., via 902, 904, 908 or 910) in a single mask. In this embodiment, the HOSH pair via (e.g., via 906, 916, 918 or 920) and the non-HOSH via (e.g., via 902, 904, 908 or 910) are not aligned in the first direction X and the second direction Y.

In some embodiments, a relationship between pitch S3 and the minimum via pitch $S_{HOSH}$ is expressed by formula 13:

$$S3 \geq S_{HOSH} \quad (13)$$

Two HOSH vias of a HOSH pair are separated from each other by a pitch S4. For example, vias 916 and 918 are separated from each other by pitch S4. Pitch S4 is measured from the center of vias 916 and 918. In this example, vias 916 and 918 are not aligned in the first direction X or the second direction Y. In some embodiments, pitch S4 is measured between two HOSH vias of a HOSH pair that are aligned in a single direction (not shown).

Pitch S4 is part of the design rules of operation 212 of method 200 (FIG. 2) for HOSH pair vias. Pitch S4 is a distance between two HOSH vias (of a HOSH pair) that are to be formed in a single mask using the HOSH process. In some embodiments, a relationship between pitch S4, the minimum via pitch G0 and the minimum via pitch $G0_{HOSH}$ is expressed by formula 14.

$$G0 \geq S4 \geq G0_{HOSH} \quad (14)$$

where G0 is the minimum spacing requirement between two vias in a single mask, and $G0_{HOSH}$ is the minimum spacing requirement between two vias in a single mask and made by a HOSH process.

In some embodiments, integrated circuit designs with via pitches (e.g., $P_{H2}$, $P_{V2}$, $P_{HP}$, S2 and S3) that satisfy the design rules of operation 212 (FIG. 2) of method 200 (e.g., spacing requirements expressed by formulas 9-14), ensure precision manufacturing of the integrated circuit by a single mask/color capable of overcoming manufacturing variations.

In some embodiments, masks manufactured having dimensions greater than corresponding minimum spacing requirements results in manufactured integrated circuits able to overcome manufacturing variations. In some embodiments, masks manufactured having dimensions less than corresponding minimum spacing requirements results in manufactured integrated circuits with possible flaws due to manufacturing variations or insufficient spacing.

Figure 10B:
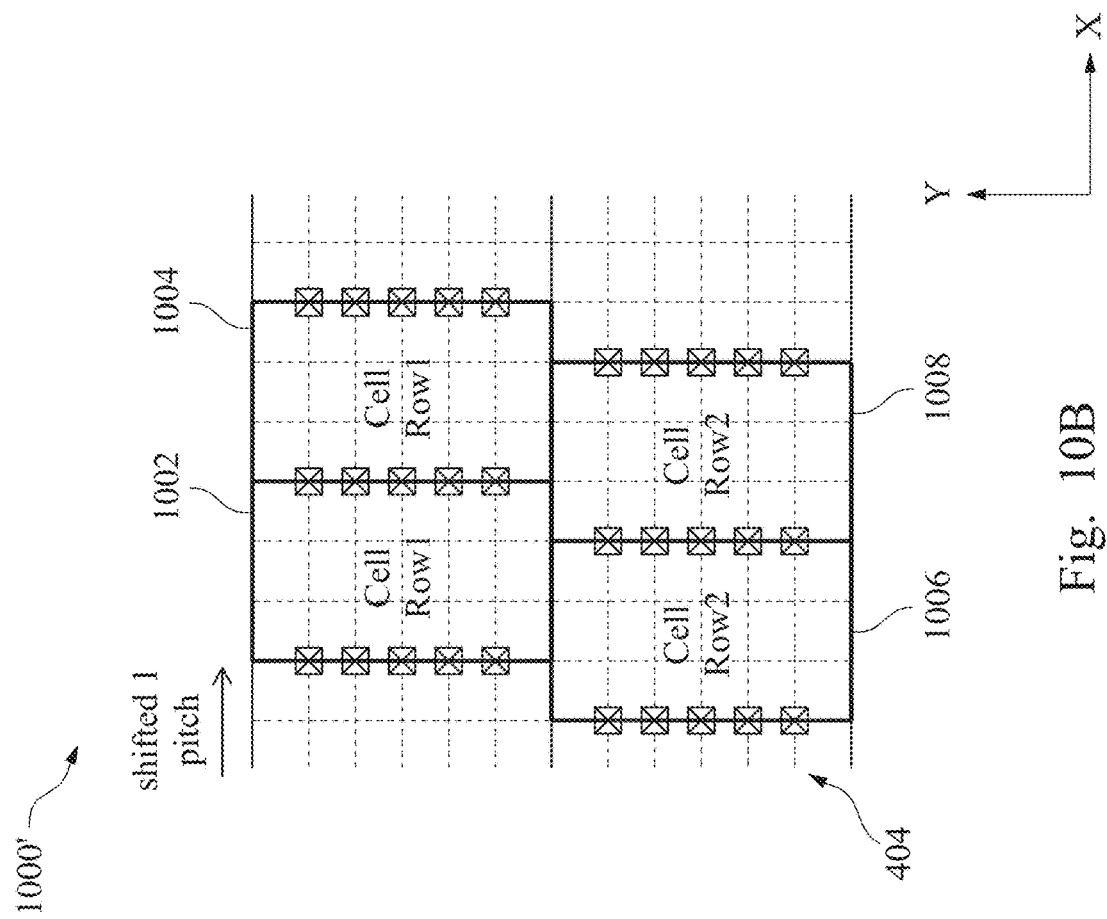
FIG. 10B is a diagram of a portion of a layout design usable as the first layout for one color in FIG. 2 or FIG. 3, in accordance with some embodiments.
Figure 10A:
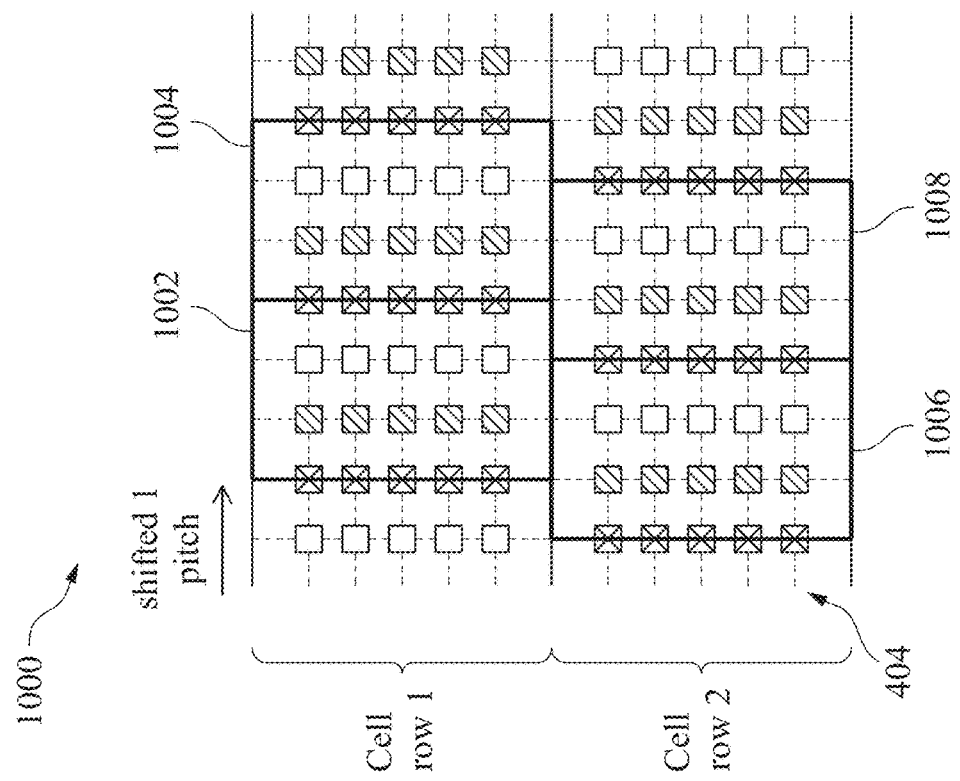
FIG. 10A is a diagram of a portion of a layout design usable as the first layout in FIG. 2 or FIG. 3, in accordance with some embodiments.

FIG. 10A is a diagram of a layout design 1000 usable as the first layout in FIG. 2 or FIG. 3, in accordance with some embodiments.

Layout design 1000 is a portion of layout design 400 (FIG. 4).

Layout design 1000 illustrates embodiments, where a first and second geometric requirement between vias is specified as part of the design rules of operation 212 of method 200 (FIG. 2).

Layout design 1000 includes vias 404 (FIG. 4) of colors A, B, and C. In some embodiments, there are more or less than three colors in layout design 1000. Vias 404 are arranged in regions 1002, 1004, 1006 and 1008. Each of regions 1002, 1004, 1006 and 1008 have vias of the same colors (e.g., A, B and C) arranged in a same pattern. Regions 1002 and 1004 are in cell row 1. Regions 1006 and 1008 are in cell row 2.

Layout design 1000 illustrates a first and second geometric requirement between vias. The first geometric requirement includes, for each cell row, vias of a same color are in the same column (e.g., aligned with each other in the second direction Y). Operation 212 of method 200 implements the first geometric requirement as a design rule. For example, in cell row 1 or 2, vias of color A are in the same column. For example, in cell row 1 or 2, vias of color B are in the same column. For example, in cell row 1 or 2, vias of color C are in the same column.

The second geometric requirement includes, for two directly adjacent cell rows, vias of a same color are shifted from each other by at least 1 column pitch in the first direction X. Regions 1002 and 1004 are shifted in the first direction X by 1 pitch (e.g., minimum pitch $P_H$) from regions 1006 and 1008. For example, vias of color A in cell row 1, are shifted in the first direction X from vias of color A in cell row 2 by 1 via pitch (e.g., minimum pitch $P_H$). For example, vias of color B in cell row 1, are shifted in the first direction X from vias of color B in cell row 2 by 1 via pitch (e.g., minimum pitch $P_H$). For example, vias of color C in cell row 1, are shifted in the first direction X from vias of color C in cell row 2 by 1 via pitch (e.g., minimum pitch $P_H$). Shifting a different number of via pitches is within the contemplated scope of the present disclosure.

FIG. 10B is a diagram of a layout design 1000' usable as the first layout for a single color in FIG. 2 or FIG. 3, in accordance with some embodiments.

In comparison with layout design 1000 of FIG. 10A, layout design 1000' does not include vias of colors A and B. Layout design 1000' is derived from layout design 1000 (FIG. 10A).

Layout design 1000' illustrates embodiments, where the first and second geometric requirements between vias are specified as part of the design rules of operation 212 of method 200 (FIG. 2) for a single color (e.g., color C). For example, in cell row 1 or 2, vias of color C are in the same column. For example, Vias of color C in cell row 1, are shifted in the first direction X from vias of color C in cell row 2 by 1 via pitch (e.g., minimum pitch $P_H$). Shifting a different number of via pitches is within the contemplated scope of the present disclosure.

Figure 11A:
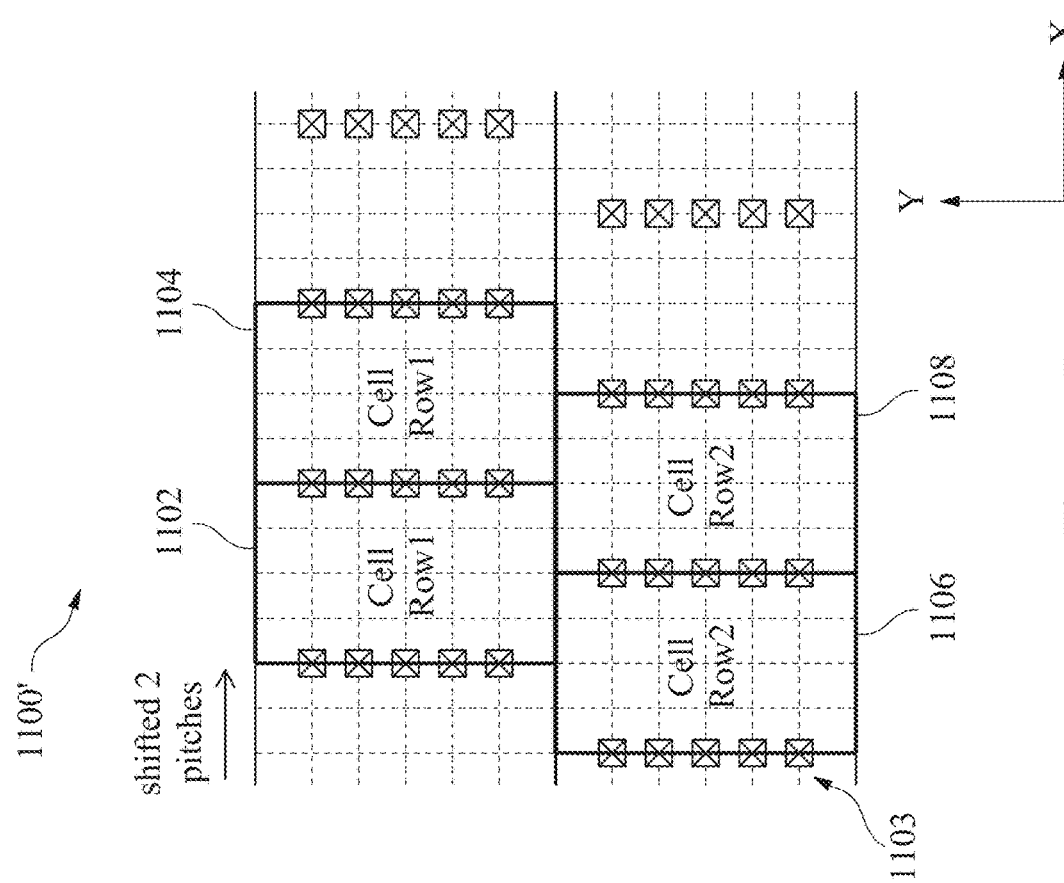
FIG. 11A is a diagram of a portion of a layout design usable as the first layout in FIG. 2 or FIG. 3, in accordance with some embodiments.

FIG. 11A is a diagram of a layout design 1100 usable as the first layout in FIG. 2 or FIG. 3, in accordance with some embodiments.

Layout design 1100 is an embodiment of layout design 400 (FIG. 4).

Layout design 1100 illustrates embodiments, where the first and second geometric requirements between vias are specified as part of the design rules of operation 212 of method 200 (FIG. 2) for 4 colors (e.g., color A, B, C, and D). In some embodiments, there are more or less than four colors in layout design 1100.

Layout design 1100 is a variation of layout design 1000 (FIG. 10A). In comparison with layout design 1000 of FIG.

10A, layout design 1100 includes vias 1103 of colors A, B, C and D. Vias 1103 are an embodiment of vias 404 (FIG. 4). Vias 1103 are arranged in regions 1102, 1104, 1106 and 1108. Each of regions 1102, 1104, 1106 and 1108 have vias of the same colors (e.g., A, B, C and D) arranged in a same pattern. Regions 1102 and 1104 are in cell row 1. Regions 1106 and 1108 are in cell row 2.

As shown in FIG. 11A, the first and second geometric requirements between vias are satisfied by layout design 1100.

Layout design 1100 satisfies the first geometric requirement because, for each cell row, vias of a same color are in the same column (e.g., aligned with each other in the second direction Y). For example, in cell row 1 or 2, vias of color A, B, C or D is in the same column.

Layout design 1100 satisfies the second geometric requirement because, for two directly adjacent cell rows, vias of a same color are shifted from each other by at least 1 column pitch in the first direction X. For example, regions 1102 and 1104 are shifted in the first direction X by 2 pitches (e.g., minimum pitch $P_H$) from regions 1106 and 1108. Shifting a different number of via pitches is within the contemplated scope of the present disclosure.

Figure 11B:
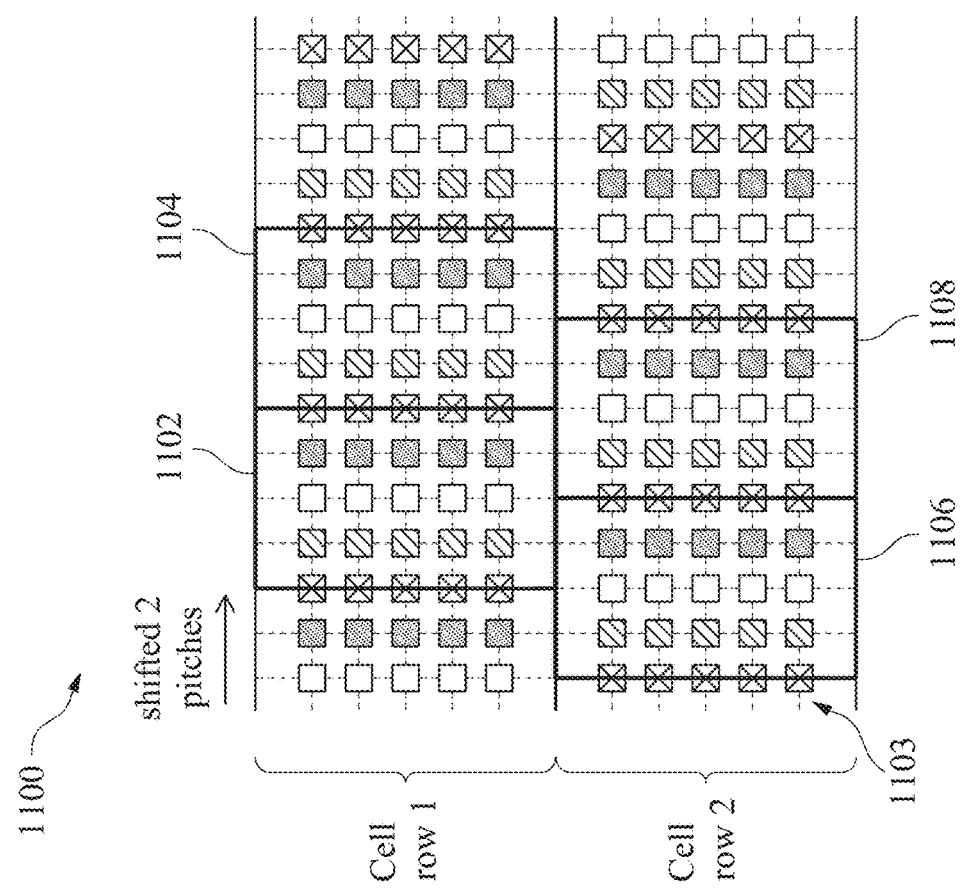
FIG. 11B is a diagram of a portion of a layout design usable as the first layout for one color in FIG. 2 or FIG. 3, in accordance with some embodiments.

FIG. 11B is a diagram of a layout design 1100' usable as the first layout for a single color in FIG. 2 or FIG. 3, in accordance with some embodiments.

In comparison with layout design 1100 of FIG. 11A, layout design 1100' does not include vias of colors A, B and C. Layout design 1100' is derived from layout design 1100 (FIG. 11A).

Layout design 1100' illustrates embodiments, where the first and second geometric requirements between vias are specified as part of the design rules of operation 212 of method 200 (FIG. 2) for a single color (e.g., color C). For example, in cell row 1 or 2, vias of color C are in the same column. For example, vias of color C in cell row 1, are shifted in the first direction X from vias of color C in cell row 2 by 2 via pitches (e.g., minimum pitch $P_H$). Shifting a different number of via pitches is within the contemplated scope of the present disclosure.

Figure 12A:
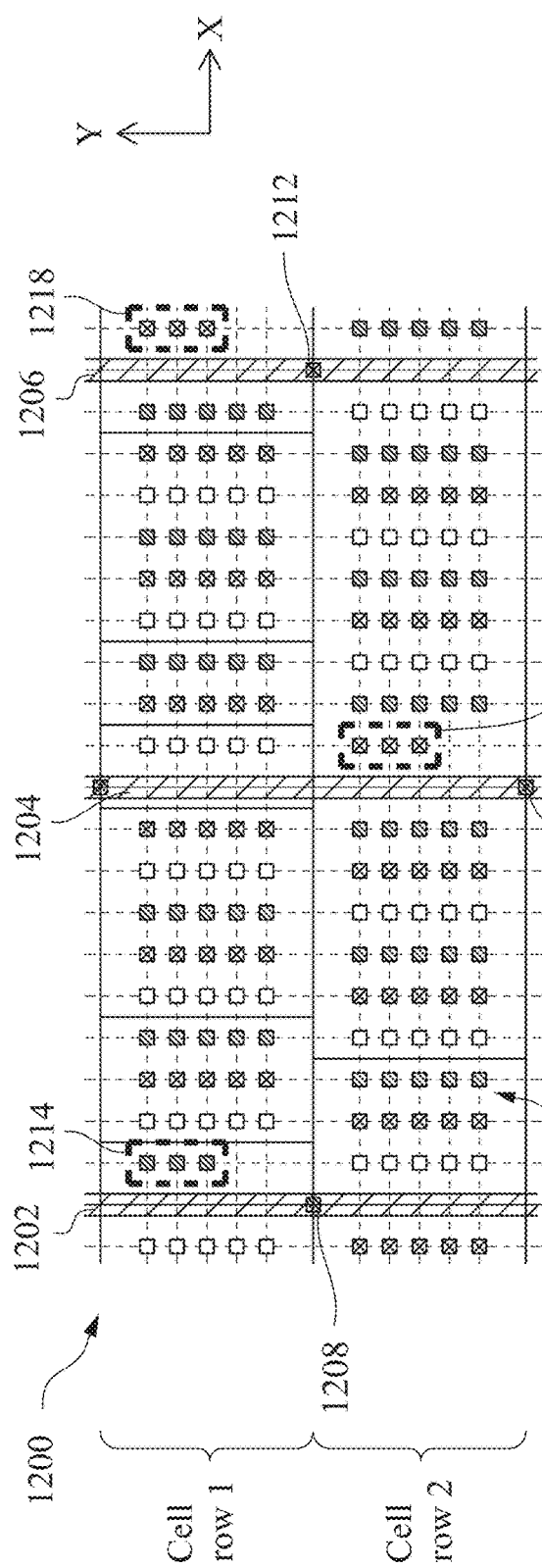
FIG. 12A is a diagram of a portion of a layout design usable as the first layout in FIG. 2 or FIG. 3, in accordance with some embodiments.

FIG. 12A is a diagram of a layout design 1200 usable as the first layout in FIG. 2 or FIG. 3, in accordance with some embodiments.

Layout design 1200 is a variation of layout design 400 (FIG. 4).

Layout design 1200 illustrates embodiments, where a minimum spacing requirement between vias and metal lines are specified as part of the place and route requirement of operation 204 of method 200 (FIG. 2).

Layout design 1200 includes conductive lines 1202, 1204 and 1206 and vias 404 (FIG. 4) of colors A, B, and C. In some embodiments, there are more or less than three colors in layout design 1200.

Vias 404 include power vias 1208, 1210 and 1218.

Power vias 1208, 1210 and 1218 are coupled to conductive lines 1202, 1204 and 1206, respectively. Power vias 1208, 1210 and 1218 are also coupled to another metal layer (not shown). Each of conductive lines 1202, 1204 or 1206 or the another metal layer (not shown) is located on metal layer M1 or metal layer M2. In some embodiments, one or more of conductive lines 1202, 1204 or 1206 is located on metal layers other than metal layer M1 or M2. In some embodiments, conductive line 1202, 1204 or 1206 are referred to as power plan metal. In some embodiments, conductive line 1202, 1204 or 1206 is coupled to a supply voltage VDD or a supply voltage VSS.

Layout design 1200 includes vias arranged in regions 1214, 1216 and 1218.

Region 1214 includes 3 vias of color A. Region 1216 and region 1218 include 3 vias of color C.

For example, power plan vias and adjacent vias of a same color satisfy place and route minimum spacing requirements specified by the design criteria of operation 204. In some embodiments, an adjacent via is a via that is located one column away from another via.

The minimum spacing requirements provide sufficient spacing between the power plan vias and any adjacent vias of a same color to ensure precision manufacturing of the integrated circuit by a single mask/color capable of overcoming manufacturing variations.

In some embodiments, to satisfy the place and route minimum spacing requirements, for each cell row, power plan vias that are located one column away from vias of a same color, 2 vias of the same color closest to the power plan via are removed. Removing a different number of vias is within the contemplated scope of the present disclosure.

For example, region 1214 has 3 vias of color A. Power plan via 1208 has a same color (e.g., color A) as vias located in region 1214, and is located one column from region 1214. As shown in FIG. 12A, region 1214 has 2 vias removed to satisfy the place and route minimum spacing requirements specified by the design criteria of operation 204.

For example, region 1216 has 3 vias of color C. Power plan via 1210 has a same color (e.g., color C) as vias located in region 1216, and is located one column from region 1216. As shown in FIG. 12A, region 1216 has 2 vias removed to satisfy the place and route minimum spacing requirements specified by the design criteria of operation 204.

For example, region 1218 has 3 vias of color C. Power plan via 1212 has a same color (e.g., color C) as vias located in region 1218, and is located one column from region 1218. As shown in FIG. 12A, region 1218 has 2 vias removed to satisfy the place and route minimum spacing requirements specified by the design criteria of operation 204.

Figure 12B:
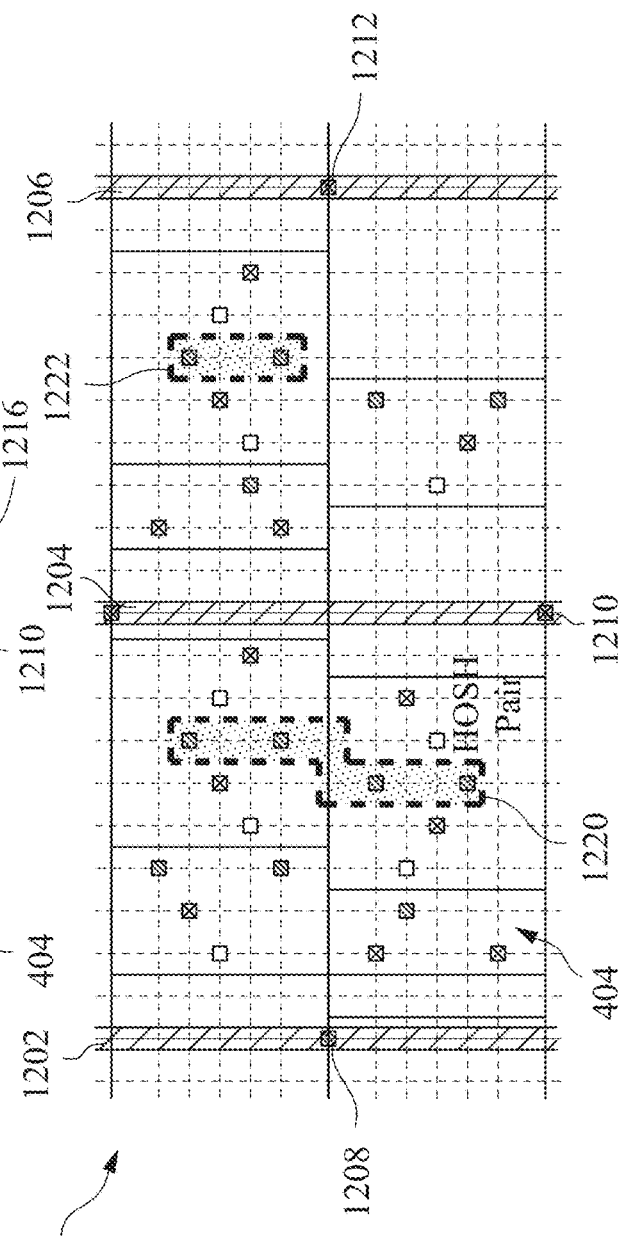
FIG. 12B is a diagram of a portion of a layout design usable as the second layout in FIG. 2 or FIG. 3, in accordance with some embodiments.

FIG. 12B is a diagram of a layout design 1200' usable as the second layout in FIG. 2 or FIG. 3, in accordance with some embodiments.

Layout design 1200' is usable as second layout 706 (FIG. 7). Layout design 1200' is derived from layout design 1200 (FIG. 12A).

Layout design 1200' illustrates embodiments after operation 304 of method 300. For example, in some embodiments, layout design 1200' is a second layout after operation 304.

In some embodiments, layout design 1200' is a via color layout for all three colors (e.g., color A, B or C). In some embodiments, there are more or less than three colors in layout design 1200'.

Layout design 1200' has HOSH pair vias 1220 and HOSH vias 1222.

As shown in FIG. 12B, HOSH pair vias 1220 have a regular pattern and have met the minimum spacing requirements specified by formulas 9-14 to utilize the HOSH process.

As shown in FIG. 12B, HOSH vias 1222 have a regular pattern and have met the minimum spacing requirements specified by formulas 9-14 to utilize the HOSH process.

Figures 13A, 13B:
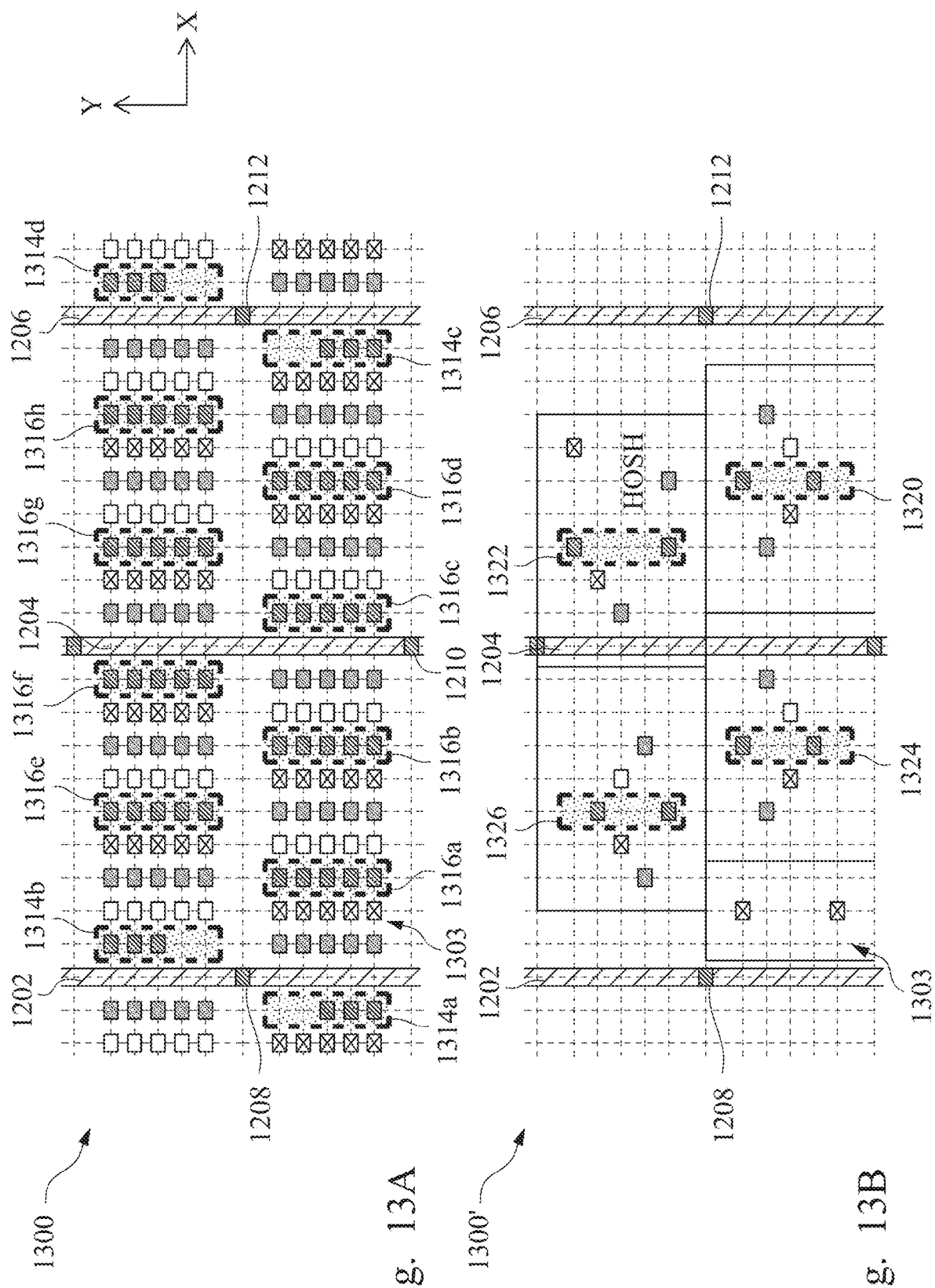
FIG. 13A is a diagram of a portion of a layout design usable as the first layout in FIG. 2 or FIG. 3, in accordance with some embodiments.
FIG. 13B is a diagram of a portion of a layout design usable as the second layout in FIG. 2 or FIG. 3, in accordance with some embodiments.

FIG. 13A is a diagram of a layout design 1300 usable as the first layout in FIG. 2 or FIG. 3, in accordance with some embodiments.

Layout design 1300 is an embodiment of layout design 400 (FIG. 4).

Layout design 1300 illustrates embodiments, where a minimum spacing requirement between vias and metal lines are specified as part of the place and route requirement of operation 204 of method 200 (FIG. 2).

Layout design 1300 is a variation of layout design 1200 (FIG. 12A). In comparison with layout design 1200 of FIG. 12A, layout design 1300 includes vias 1303 of colors A, B, C and D. In some embodiments, there are more or less than four colors in layout design 1300. Vias 1303 are an embodiment of vias 404 (FIG. 4). Layout design 1300 includes vias arranged in regions 1314*a*-1314*d* and regions 1316*a*-1316*h*.

Regions 1314*a*-*d* has 3 vias of a single color to satisfy the place and route minimum spacing requirements specified by the design criteria of operation 204. A different number of vias to satisfy the place and route minimum spacing requirements is within the contemplated scope of the present disclosure.

Regions 1314*a*-1314*d* and regions 1316*a*-1316*h* include vias of a single color that have regular patterns which would be suitable for the HOSH process if they met the minimum spacing requirements specified by formulas 9-13.

FIG. 13B is a diagram of a layout design 1300' usable as the second layout in FIG. 2 or FIG. 3, in accordance with some embodiments.

Layout design 1300' is usable as second layout 706 (FIG. 7). Layout design 1300' is derived from layout design 1300 (FIG. 13A).

Layout design 1300' illustrates embodiments after operation 304 of method 300. For example, in some embodiments, layout design 1300' is a second layout after operation 304.

In some embodiments, layout design 1300' is a via color layout for all four colors (e.g., color A, B, C or D). In some embodiments, there are more or less than four colors in layout design 1300'.

Layout design 1300' has HOSH vias 1320, 1322, 1324 and 1326. As shown in FIG. 13B, HOSH vias 1320, 1322, 1324 and 1326 have a regular pattern and have met the minimum spacing requirements specified by formulas 9-14 to utilize the HOSH process.

Components that are the same or similar to those in each of FIGS. 1, 4-8, 9A-9B, 10A-10B, 11A-11B, 12A-12B and 13A-13B are given the same reference numbers, and detailed description thereof is thus omitted.

Figure 14:
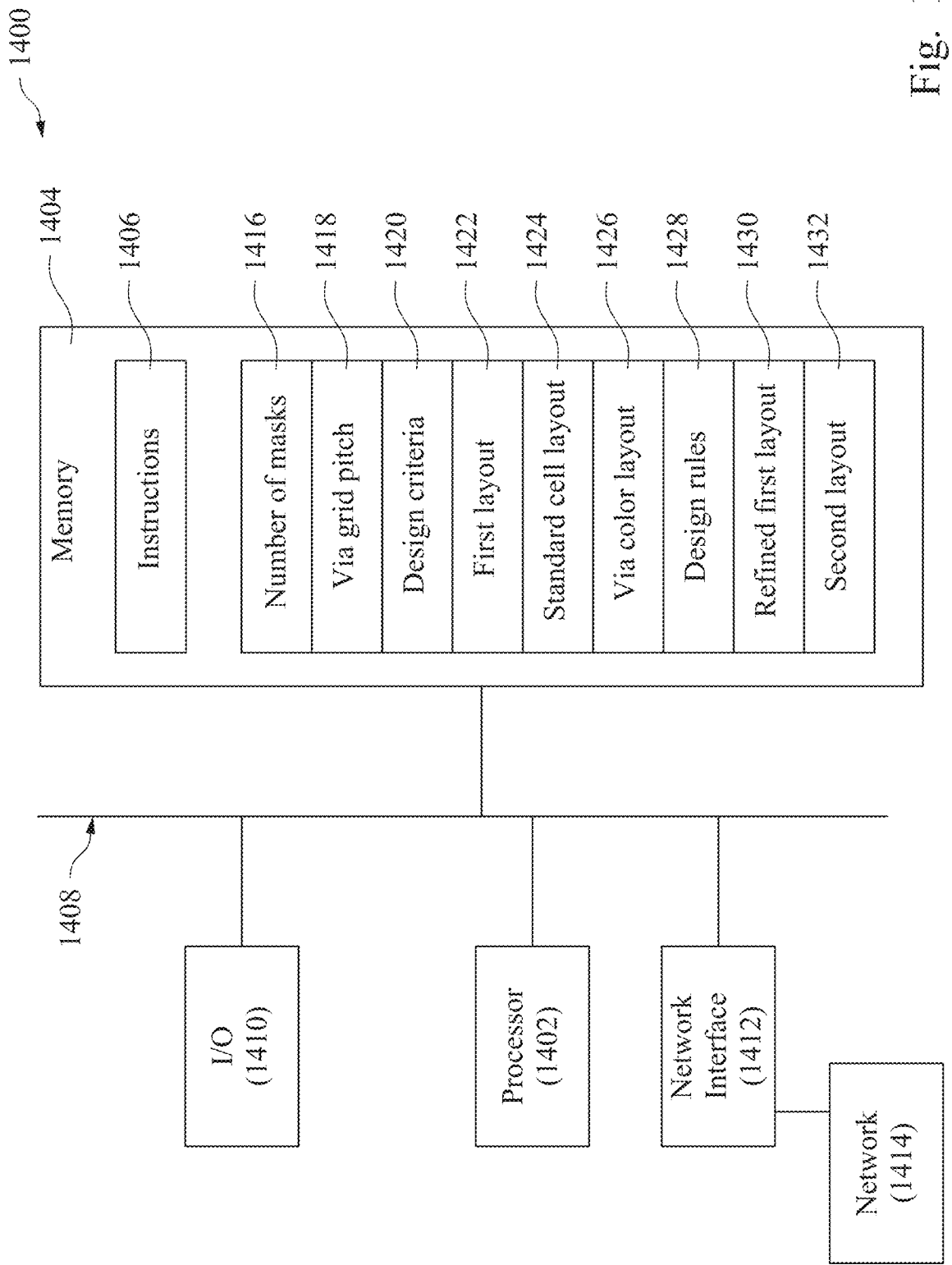
FIG. 14 is a block diagram of a system of forming a layout design in accordance with some embodiments.

FIG. 14 is a schematic view of a system 1400 for designing an integrated circuit in accordance with some embodiments. System 1400 includes a hardware processor 1402 and a non-transitory, computer readable storage medium 1404 encoded with, i.e., storing, the computer program code 1406, i.e., a set of executable instructions. The computer program code 1406 is configured to interface with manufacturing machines for producing the integrated circuit. The processor 1402 is electrically coupled to the computer readable storage medium 1404 via a bus 1408. The processor 1402 is also electrically coupled to an I/O interface 1410 by bus 1408. A network interface 1412 is also electrically connected to the processor 1402 via bus 1408. Network interface 1412 is connected to a network 1414, so that processor 1402 and computer readable storage medium 1404 are capable of connecting to external elements via network 1414. The processor 1402 is configured to execute the computer program code 1406 encoded in the computer readable storage medium 1404 in order to cause system 1400 to be usable for performing a portion or all of the operations as described in method 200 or method 300.

In some embodiments, the processor 1402 is a central processing unit (CPU), a multi-processor, a distributed processing system, an application specific integrated circuit (ASIC), and/or a suitable processing unit. In some embodiments, the processor 1402 is a specific purpose processing device configured to execute instructions to cause the processing device to perform a specific operation or set of operations of method 200 or 300.

In some embodiments, the computer readable storage medium 1404 is an electronic, magnetic, optical, electromagnetic, infrared, and/or a semiconductor system (or apparatus or device). For example, the computer readable storage medium 1404 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1404 includes a compact disk-read only memory (CD-ROM), a compact disk-read/write (CD-R/W), and/or a digital video disc (DVD).

In some embodiments, the storage medium 1404 stores the computer program code 1406 configured to cause system 1400 to perform method 200 or method 300. In some embodiments, the storage medium 1404 also stores information needed for performing a method 200 or 300 as well as information generated during performing the method 200 or 300, such as a number of masks parameter 1416, a via grid pitch parameter 1418, a design criteria parameter 1420, a first layout parameter 1422, a standard cell layout parameter 1424, a via color layout parameter 1426, a design rules parameter 1428, a refined first layout parameter 1430 and a second layout parameter 1432, and/or a set of executable instructions to perform the operation of method 200 or 300.

In some embodiments, the storage medium 1404 stores the computer program code 1406 for interfacing with manufacturing machines. The computer program code 1406 enable processor 1402 to generate manufacturing instructions readable by the manufacturing machines to effectively implement method 200 or method 300 during a manufacturing process.

System 1400 includes I/O interface 1410. I/O interface 1410 is coupled to external circuitry. In some embodiments, I/O interface 1410 includes a keyboard, keypad, mouse, trackball, trackpad, and/or cursor direction keys for communicating information and commands to processor 1402.

System 1400 also includes network interface 1412 coupled to the processor 1402. Network interface 1412 allows system 1400 to communicate with network 1414, to which one or more other computer systems are connected. Network interface 1412 includes wireless network interfaces such as BLUETOOTH, WIFI, WIMAX, GPRS, or WCDMA; or wired network interface such as ETHERNET, USB, or IEEE-1394. In some embodiments, method 200 or 300 is implemented in two or more systems 1400, and information such as number of masks, via grid pitch, design criteria, first layout, standard cell layout, via color layout, design rules, refined first layout and second layout are exchanged between different systems 1400 via network 1414.

System 1400 is configured to receive information related to a number of masks through I/O interface 1410 or network interface 1412. The information is transferred to processor 1402 via bus 1408 to determine a number of masks used for producing a layer of a semiconductor device. The number of masks is then stored in computer readable medium 1404 as number of masks parameter 1416. System 1400 is configured to receive information related to via grid pitch through I/O interface 1410 or network interface 1412. The information is stored in computer readable medium 1404 as via grid pitch parameter 1418. System 1400 is configured to receive information related to design criteria through I/O interface 1410 or network interface 1412. The information is stored in computer readable medium 1404 as design criteria parameter 1420. System 1400 is configured to receive information related to a first layout through I/O interface 1410 or network interface 1412. The information is stored in computer readable medium 1404 as first layout parameter 1422. System 1400 is configured to receive information related to a standard cell layout through I/O interface 1410 or network interface 1412. The information is stored in computer medium 1404 as standard cell layout parameter 1424. System 1400 is configured to receive information related to a via color layout through I/O interface 1410 or network interface 1412. The information is stored in computer readable medium 1404 as via color layout parameter 1426. System 1400 is configured to receive information related to a design rules through I/O interface 1410 or network interface 1412. The information is stored in computer readable medium 1404 as design rules parameter 1428. System 1400 is configured to receive information related to a refined first layout through I/O interface 1410 or network interface 1412. The information is stored in computer readable medium 1404 as refined first layout parameter 1430. System 1400 is configured to receive information related to a second layout through I/O interface 1410 or network interface 1412. The information is stored in computer readable medium 1404 as second layout parameter 1432.

One aspect of this description relates to a method of fabricating an integrated circuit. The method includes defining a via grid having a first minimum pitch in a first direction and a second minimum pitch in a second direction different from the first direction, generating a first layout design of the integrated circuit based on at least the via grid or design criteria, generating a standard cell layout design of the integrated circuit, generating a via color layout design of the integrated circuit based on the first layout design and the standard cell layout design, performing a color check on the via color layout design based on design rules, and at least one of the above operations being performed by a hardware processor. The method further includes manufacturing the integrated circuit based on at least the via color layout design. In some embodiments, the first layout design has a first set of vias arranged in first rows and first columns based on the via grid. In some embodiments, the first rows of the first set of vias are arranged in the first direction, and the first columns of the first set of vias are arranged in the second direction. In some embodiments, the first set of vias are divided into sub-sets of vias based on a corresponding color. In some embodiments, the color indicates that vias of the sub-set of vias with a same color are to be formed on a same mask of a multiple mask set and vias of the sub-set of vias with a different color are to be formed on a different mask of the multiple mask set. In some embodiments, the standard cell layout design has standard cells and a second set of vias arranged in the standard cells. In some embodiments, the via color layout design has a third set of vias. In some embodiments, the third set of vias include a portion of the second set of vias and corresponding locations, and color of the corresponding sub-set of vias.

Another aspect of this description relates to a system for manufacturing an integrated circuit. The system comprises a non-transitory computer readable medium configured to store executable instructions; and a processor coupled to the non-transitory computer readable medium. The processor is configured to execute the executable instructions for defining a via grid having a first minimum pitch in a first direction and a second minimum pitch in a second direction different from the first direction, generating a first layout design of the integrated circuit based on at least the via grid or design criteria, generating a standard cell layout design of the integrated circuit, generating a via color layout design of the integrated circuit based on the first layout design and the standard cell layout design, and performing a color check on the via color layout design based on design rules. In some embodiments, the first layout design has a first set of vias arranged in first rows and first columns based on the via grid. In some embodiments, the first rows of the first set of vias are arranged in the first direction, and the first columns of the first set of vias are arranged in the second direction. In some embodiments, the first set of vias are divided into sub-sets of vias based on a corresponding color. In some embodiments, the color indicates that vias of the sub-set of vias with a same color are to be formed on a same mask of a multiple mask set and vias of the sub-set of vias with a different color are to be formed on a different mask of the multiple mask set. In some embodiments, the standard cell layout design has standard cells and a second set of vias arranged in the standard cells. In some embodiments, the via color layout design has a third set of vias. In some embodiments, the third set of vias includes a portion of the second set of vias and corresponding locations, and color of the corresponding sub-set of vias.

Still another aspect of this description relates to a method of manufacturing an integrated circuit. The method includes defining design criteria of the integrated circuit, generating a first layout design of the integrated circuit based on the design criteria, generating a standard cell layout design of the integrated circuit, performing a color mapping between the first layout design and the standard cell layout design thereby generating a via color layout design of the integrated circuit, at least one of the above operations being performed by a hardware processor. The method further includes manufacturing the integrated circuit based on at least the via color layout design. In some embodiments, the first layout design has a first set of vias arranged in first rows and first columns. In some embodiments, the first rows of the first set of vias are arranged in a first direction, and the first columns of the first set of vias are arranged in a second direction different from the first direction. In some embodiments, the first set of vias are divided into sub-sets of vias based on a corresponding color. In some embodiments, the color indicates that vias of the sub-set of vias with a same color are to be formed on a same mask of a multiple mask set and vias of the sub-set of vias with a different color are to be formed on a different mask of the multiple mask set. In some embodiments, the standard cell layout design has standard cells and a second set of vias arranged in the standard cells. In some embodiments, the via color layout design has a third set of vias. In some embodiments, the third set of vias includes a portion of the second set of vias and corresponding locations, and color of the corresponding sub-set of vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit, the method comprising:

defining a via grid having a first minimum pitch in a first direction and a second minimum pitch in a second direction different from the first direction;

generating a first layout design of the integrated circuit based on at least the via grid or design criteria, the first layout design having a first set of vias arranged in first rows and first columns based on the via grid, the first rows of the first set of vias being arranged in the first direction, the first columns of the first set of vias being arranged in the second direction, the first set of vias being divided into sub-sets of vias based on a corresponding color, the color indicating that vias of the sub-set of vias with a same color are to be formed on a same mask of a multiple mask set and vias of the sub-set of vias with a different color are to be formed on a different mask of the multiple mask set;

generating a standard cell layout design of the integrated circuit, the standard cell layout design having standard cells and a second set of vias arranged in the standard cells;

generating a via color layout design of the integrated circuit based on the first layout design and the standard cell layout design, the via color layout design having a third set of vias, the third set of vias including a portion of the second set of vias and corresponding locations, and color of the corresponding sub-set of vias;

performing a color check on the via color layout design based on design rules, and at least one of the above operations being performed by a hardware processor, and fabricating the integrated circuit based on at least the via color layout design.

2. The method of claim 1, wherein generating the via color layout design of the integrated circuit based on the first layout design and the standard cell layout design comprises:

performing a color mapping between the first layout design and the standard cell layout design.

3. The method of claim 2, wherein performing the color mapping between the first layout design and the standard cell layout design comprises:

adding the second set of vias and corresponding locations of the standard cell layout design to a second layout design at same corresponding locations in the second layout design;

adding the colors of the first set of vias in the first layout design to corresponding vias of the second set of vias in the second layout design, and filtering the second layout design based upon the color thereby generating a filtered second layout design, each via in the filtered second layout design has the same color.

4. The method of claim 1, wherein the design criteria comprises a first set of spacing requirements that are part of the design rules, and the first set of spacing requirements includes at least one or more of a first minimum via pitch (G0) between each pair of vias of the third set of vias in the same mask, G0 being expressed by:

$$P_{poly} \leq G0 \leq 3*P_{poly}$$

where $P_{poly}$ is a minimum pitch between a poly region and an adjacent poly region of the via color layout design;

a second minimum via pitch ($S_{HOSH}$) between a first HOSH via and a first via of the third set of vias in the same mask, $S_{HOSH}$ being expressed by:

$$P_{poly} \leq S_{HOSH} \leq 3*P_{poly}$$

the first HOSH via having an area less than an area of non-HOSH vias of the third set of vias in the same mask; or a third minimum via pitch ($G0_{HOSH}$) between the first HOSH via and a second HOSH via of the third set of vias in the same mask, $G0_{HOSH}$ being expressed by:

$$0.5*P_{poly} \leq G0_{HOSH} \leq 2*P_{poly}$$

the second HOSH via having an area less than the area of non-HOSH vias of the third set of vias in the same mask.

5. The method of claim 4, wherein the design rules further include at least one or more of:

satisfying a second set of spacing requirements for the third set of vias; or determining if two or more vias of the third set of vias are aligned in the first direction or the second direction.

6. The method of claim 5, wherein the second set of spacing requirements comprises at least one or more of:

a via pitch ($P_{V1}$) between the first via and a second via of the third set of vias in the same mask, and the first via and the second via of the third set of vias are aligned in the second direction, $P_{V1}$ being expressed by:

$$P_{V1}=P_V*N1$$

where N1 is a positive integer and pitch $P_V$ is the minimum pitch of at least the via color layout design in the second direction;

a via pitch ($P_{H1}$) between the first via and a third via of the third set of vias in the same mask, and the first via and the third via of the third set of vias are aligned in the first direction, $$P_{H1}=P_H*M*N$$

where M is a number of masks, N is a positive integer, and pitch $P_H$ is the minimum pitch of at least the via color layout design in the first direction;

a pitch (S1) between the second via and the third via of the third set of vias, and the second via and the third via are not aligned in the first direction and the second direction, S1 is greater than or equal to $S_{HOSH}$;

a pitch (S2) between the first via and the first HOSH via, and the first via and the first HOSH via are not aligned in the first direction and the second direction, S2 is greater than or equal to $S_{HOSH}$;

a via pitch ($P_1$) between the first HOSH via and the second HOSH via, and the first HOSH via and the second HOSH via being aligned in the first direction or the second direction;

$P_1$ is less than or equal to G0;

$P_1$ is greater than or equal to $G0_{HOSH}$; or $P_{V1}$ or $P_{H1}$ is greater than or equal to G0.

7. The method of claim 1, wherein the design criteria comprises at least one of:

a layout requirement of the integrated circuit;

a place and route requirement of the integrated circuit;

a mask count; or one or more via spacing rules.

8. The method of claim 7, wherein the layout requirement of the integrated circuit includes:

a first minimum spacing between two vias of the second set of vias in a same row, or a second minimum spacing between two vias of the second set of vias in a same column;
the place and route requirement of the integrated circuit includes minimum spacing requirements between power plan vias and adjacent vias of the sub-sets of vias, the power plan vias and adjacent vias of the sub-sets of vias being the same color, or
the mask count corresponds to a number of masks in the multiple mask set.

9. The method of claim 8, wherein
the first minimum spacing between the two vias of the second set of vias in the same row includes:
the two vias of the second set of vias in the same row being separated from each other by at least 1 minimum pitch ($P_H$) in the first direction;
the second minimum spacing between the two vias of the second set of vias in the same column includes:
the two vias of the second set of vias in the same column being separated from each other by at least 2 minimum pitches ($P_V$) in the second direction, or
the mask count is 3 or more.

10. A system for manufacturing an integrated circuit, the system comprises:
a non-transitory computer readable medium configured to store executable instructions; and
a processor coupled to the non-transitory computer readable medium, wherein the processor is configured to execute the executable instructions for:
defining a via grid having a first minimum pitch in a first direction and a second minimum pitch in a second direction different from the first direction;
generating a first layout design of the integrated circuit based on at least the via grid or design criteria, the first layout design having a first set of vias arranged in first rows and first columns based on the via grid, the first rows of the first set of vias being arranged in the first direction, the first columns of the first set of vias being arranged in the second direction, the first set of vias being divided into sub-sets of vias based on a corresponding color, the color indicating that vias of the sub-set of vias with a same color are to be formed on a same mask of a multiple mask set and vias of the sub-set of vias with a different color are to be formed on a different mask of the multiple mask set;
generating a standard cell layout design of the integrated circuit, the standard cell layout design having standard cells and a second set of vias arranged in the standard cells;
generating a via color layout design of the integrated circuit based on the first layout design and the standard cell layout design, the via color layout design having a third set of vias, the third set of vias including a portion of the second set of vias and corresponding locations, and color of the corresponding sub-set of vias; and
performing a color check on the via color layout design based on design rules.

11. The system of claim 10, wherein the processor is configured to execute the executable instructions for generating the first layout design of the integrated circuit based on at least the via grid or the design criteria, the design criteria comprising at least:
one or more via spacing rules;
a layout requirement of the integrated circuit;
a place and route requirement of the integrated circuit including minimum spacing requirements between power plan vias and adjacent vias of the sub-sets of vias, the power plan vias and adjacent vias of the sub-sets of vias being the same color; or
a mask count.

12. The system of claim 11, wherein the processor is configured to execute the executable instructions for generating the first layout design of the integrated circuit based on at least the via grid or the design criteria, the design criteria comprising at least the layout requirement of the integrated circuit including at least:
a first minimum spacing between two vias of the second set of vias in a same row being separated from each other by at least 1 minimum pitch ($P_H$) in the first direction; or
a second minimum spacing between two vias of the second set of vias in a same column being separated from each other by at least 2 minimum pitches ($P_V$) in the second direction.

13. The system of claim 11, wherein the processor is configured to execute the executable instructions for generating the first layout design of the integrated circuit based on at least the via grid or the design criteria, the design criteria being part of the design rules, and the design criteria comprising at least the one or more via spacing rules including at least:
a first minimum via pitch (G0) between each pair of vias of the third set of vias in the same mask, G0 being expressed by:

$$P_{poly} \leq G0 \leq 3*P_{poly}$$

where $P_{poly}$ is a minimum pitch between a poly region and an adjacent poly region of the via color layout design;
a second minimum via pitch ($S_{HOSH}$) between a first HOSH via and a first via of the third set of vias in the same mask, $S_{HOSH}$ being expressed by:

$$P_{poly} \leq S_{HOSH} \leq 3*P_{poly}$$

the first HOSH via having an area less than an area of non-HOSH vias of the third set of vias in the same mask; or
a third minimum via pitch ($G0_{HOSH}$) between the first HOSH via and a second HOSH via of the third set of vias in the same mask, $G0_{HOSH}$ being expressed by:

$$0.5*P_{poly} \leq G0_{HOSH} \leq 2*P_{poly}$$

the second HOSH via having an area less than the area of non-HOSH vias of the third set of vias in the same mask.

14. The system of claim 13, wherein the processor is configured to execute the executable instructions for performing the color check on the via color layout design based on the design rules, the design rules comprising at least one or more of:
satisfying a set of spacing requirements for the third set of vias; or
determining if two or more vias of the third set of vias are aligned in the first direction or the second direction.

15. The system of claim 14, wherein the processor is configured to execute the executable instructions for performing the color check on the via color layout design based on the design rules, the design rules comprising at least one or more of satisfying the set of spacing requirements for the third set of vias, the set of spacing requirements comprises at least one or more of:
a via pitch ($P_{V1}$) between the first via and a second via of the third set of vias in the same mask, and the first via and the second via of the third set of vias are aligned in the second direction, $P_{V1}$ being expressed by:

$$P_{V1}=P_V*N1$$

where N1 is a positive integer and pitch $P_V$ is the minimum pitch of at least the via color layout design in the second direction;

a via pitch ($P_{H1}$) between the first via and a third via of the third set of vias in the same mask, and the first via and the third via of the third set of vias are aligned in the first direction, $$P_{H1}=P_H*M*N$$

where M is a number of masks, N is a positive integer, and pitch $P_H$ is the minimum pitch of at least the via color layout design in the first direction;

a pitch (S1) between the second via and the third via of the third set of vias, and the second via and the third via are not aligned in the first direction and the second direction, S1 is greater than or equal to $S_{HOSH}$;

a pitch (S2) between the first via and the first HOSH via, and the first via and the first HOSH via are not aligned in the first direction and the second direction, S2 is greater than or equal to $S_{HOSH}$;

a via pitch ($P_1$) between the first HOSH via and the second HOSH via, and the first HOSH via and the second HOSH via being aligned in the first direction or the second direction;

$P_1$ is less than or equal to G0;

$P_1$ is greater than or equal to $G0_{HOSH}$; or $P_{V1}$ or $P_{H1}$ is greater than or equal to G0.

16. The system of claim 11, wherein the processor is configured to execute the executable instructions for generating the via color layout design based on the first layout design and the standard cell layout design comprises the processor being configured to execute the executable instructions for:

performing a color mapping between the first layout design and the standard cell layout design.

17. The system of claim 16, wherein the processor is configured to execute the executable instructions for performing the color mapping between the first layout design and the standard cell layout design comprises the processor being configured to execute the executable instructions for:

adding features of the standard cell layout design to a second layout design;

adding the colors of features in the first layout design to corresponding features in the second layout design, and filtering the second layout design based upon the color thereby generating a filtered second layout design, each via in the filtered second layout design has the same color.

18. A method of manufacturing an integrated circuit, the method comprising:

defining design criteria of the integrated circuit;

generating a first layout design of the integrated circuit based on the design criteria, the first layout design having a first set of vias arranged in first rows and first columns, the first rows of the first set of vias being arranged in a first direction, the first columns of the first set of vias being arranged in a second direction different from the first direction, the first set of vias being divided into sub-sets of vias based on a corresponding color, the color indicating that vias of the sub-set of vias with a same color are to be formed on a same mask of a multiple mask set and vias of the sub-set of vias with a different color are to be formed on a different mask of the multiple mask set;

generating a standard cell layout design of the integrated circuit, the standard cell layout design having standard cells and a second set of vias arranged in the standard cells;

performing a color mapping between the first layout design and the standard cell layout design thereby generating a via color layout design of the integrated circuit, the via color layout design having a third set of vias, the third set of vias including a portion of the second set of vias and corresponding locations, and color of the corresponding sub-set of vias;

at least one of the above operations being performed by a hardware processor, and manufacturing the integrated circuit based on at least the via color layout design.

19. The method of claim 18, wherein the design criteria comprises one or more via spacing rules;

a layout requirement of the integrated circuit including at least:

a first minimum spacing between two vias of the second set of vias in a same row being separated from each other by at least 1 minimum pitch ($P_H$) in the first direction; or a second minimum spacing between two vias of the second set of vias in a same column being separated from each other by at least 2 minimum pitches ($P_V$) in the second direction;

a place and route requirement of the integrated circuit including minimum spacing requirements between power plan vias and adjacent vias of the sub-sets of vias, the power plan vias and adjacent vias of the sub-sets of vias being the same color; or a mask count corresponding to a number of masks in the multiple mask set.

20. The method of claim 18, wherein performing the color mapping between the first layout design and the standard cell layout design comprises:

adding the standard cells, the second set of vias and corresponding locations of the standard cells and the second set of vias to a second layout design at same corresponding locations in the second layout design;

for each via in the second set of vias, if a via in the second set of vias has a same location as a via in the first set of vias, adding the color of the via in the first set of vias to a corresponding via in the second layout design, and filtering the second layout design based upon the color thereby generating a filtered second layout design, wherein each via in the filtered second layout design has the same color, the filtered second layout design corresponds to the via color layout design, and the first layout design and the standard cell layout design have a same size in the first direction and the second direction.

* * * * *